United States Patent [19]

Mashiko et al.

[11] Patent Number: 5,541,529
[45] Date of Patent: Jul. 30, 1996

[54] FIELD PROGRAMMABLE GATE ARRAY TRANSFERRING SIGNALS AT HIGH SPEED

[75] Inventors: Koichiro Mashiko; Hiroaki Suzuki, both of Hyogo, Japan

[73] Assignee: Mitsubishi Denki Kabushiki Kaisha, Tokyo, Japan

[21] Appl. No.: 450,757

[22] Filed: May 25, 1995

[30] Foreign Application Priority Data

May 26, 1994 [JP] Japan ................................. 6-113092

[51] Int. Cl.$^6$ ............................................. H03K 19/173
[52] U.S. Cl. ................................ 326/39; 326/38; 326/44
[58] Field of Search ................................. 326/39, 38, 40, 326/44, 80, 81, 33, 34, 9

[56] References Cited

U.S. PATENT DOCUMENTS

| | | | |
|---|---|---|---|
| 4,746,921 | 5/1988 | Hofmann | 326/41 |
| 4,870,302 | 9/1989 | Freeman | 326/41 |
| 5,121,111 | 6/1992 | Trumpp et al. | 326/41 |
| 5,239,510 | 8/1993 | Hill | 365/226 |
| 5,329,460 | 7/1994 | Agrawal et al. | 326/41 |

FOREIGN PATENT DOCUMENTS 5-243973  9/1993  Japan.

OTHER PUBLICATIONS

Xilinx The Programmable Gate Array Data Book, 1992 month available, pp. 2–26, 2–27, 2–62, 2–63, 2–66, 2–67, 2–70, 2–72.

A User Programmable Reconfigurable Logic Array, William S. Carter et al, IEEE 1986 month available Custom Integrated Circuits Conference, pp. 233–235.

Optimal Configuration of Sense Circuit for dynamic MOS Memory, Jun–ichi INOUE et al, Musashino Electrical Communication Laboratory, N.T.T., 1980 month available, vol. SSD80–44, pp. 69–76.

Primary Examiner—Edward P. Westin
Assistant Examiner—Richard Roseen
Attorney, Agent, or Firm—Lowe, Price, LeBlanc & Becker

[57] ABSTRACT

A field programmable gate array includes a logic blocks, switching elements for establishing a signal propagation path, and memory cells provided corresponding to the switching elements for storing data determining on and off states of corresponding switching elements. In this gate array, a supply voltage fed to a power input terminal is transmitted to power supply nodes of logic circuit blocks. A booster circuit boosts the supply voltage fed to the power input terminal and feeds the boosted voltage to power supply nodes of memory cells for programming a signal propagation path. A high-level signal potential of each memory cell is fed to the gate of an n-channel MOS transistor which functions as the switching element. The switching elements are disposed on signal lines and serve to interconnect the signal lines selectively to establish a signal propagation path. The current supply capability of the MOS transistors is enhanced to realize faster propagation of the signal, and any harmful influence of the threshold voltage exerted on the signal amplitude loss can be suppressed by a rise of the gate potential in each MOS transistor.

15 Claims, 24 Drawing Sheets

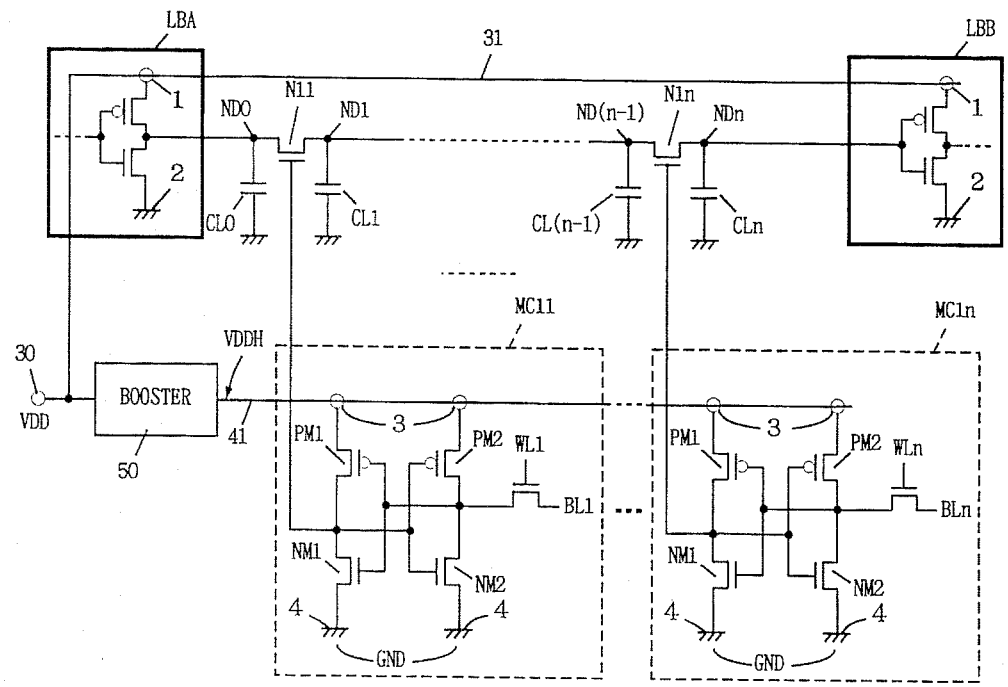

FIELD PROGRAMMABLE GATE ARRAY TRANSFERRING SIGNALS AT HIGH SPEED

BACKGROUND OF THE INVENTION

1. Field of the Invention

The present invention relates to a programmable logic device and, more particularly, to a field programmable gate array where desired logics to be realized are programmable by a user in accordance with individual application. Further particularly, the invention relates to improvements in a signal transmission circuit to reduce a signal propagation delay in a field programmable gate array.

2. Description of the Related Art

Out of logic integrated circuits designed to realize logics that satisfy the specifications required by users, there is known a gate array. In such a gate array, transistors are arrayed regularly, and interconnection lines programmed by a mask in accordance with each users' required specification, to interconnect the transistors (gates) to thereby realize the desired logics. In a gate array, however, since logics are programmed by means of mask interconnection lines, it is impossible to rearrange the logics once programmed. Gate arrays of this type are intended to be mass-produced to a certain extent. When a user forms a logic circuit as a trial or needs merely a small amount of logic circuits, there is used a programmable logic device termed "field programmable logic array (FPGA)". This field programmable logic array incorporates memory cells (SRAM cells), which are programmed to realize a desired internal circuit specification (including internal logic construction and line connection).

FIG. 19 schematically shows a whole constitution of a conventional field programmable gate array. Referring to FIG. 19, input/output blocks IOB are disposed along peripheral portions of a chip, and programmable logic circuit blocks PLB are disposed to form a matrix of rows and columns in the inner region of these input/output blocks IOB. The input/output blocks IOB correspond respectively to data input/output terminals (not shown), and the internal constructions thereof are programmable. Also the internal logic constructions of the programmable logic circuit blocks PLB are programmable as well. Exemplary programming thereof will be described later.

The region between the programmable logic circuit blocks PLB, and also the region between the input/output blocks IOB and the programmable logic circuit blocks PLB, are each utilized as interconnection regions IR. As will be explained later, interconnection lines for interconnecting circuit blocks are disposed in the interconnection line region IR. In this interconnection line region IR, switching transistors are arranged corresponding to intersections of the interconnection lines. And connections of the interconnection lines IL between input/output blocks IOB and programmable logic circuit blocks PLB, and also signal propagation paths therebetween, are established by setting the on/off states of switching transistors in accordance with storage data in the memory cells. A memory cell is provided in each of the input/output blocks IOB and the programmable logic circuit blocks PLB, and the functions of circuit blocks are programmed by externally writing storage data in the memory cells.

As will be described later, the memory cells are so arranged as to form a matrix of rows and columns in the interconnection line region. A data shift register DR and an address shift register AR are provided for writing data in the memory cells. The data shift register DR sequentially shifts the data obtained from a not-shown data input terminal and stores the data to be written in the memory cells of one row. The address shift register AR generates a signal to select one row of the memory cells in response to a clock signal obtained from a not-shown clock buffer. Consequently, the stored data in the data shift register are written in the memory cells of one row simultaneously.

FIG. 20 shows a configuration of the interconnection line regions shown in FIG. 19. In FIG. 20, interconnection line groups ILG are disposed in the interconnection line region IR among a plurality (six in FIG. 20) of programmable logic circuit blocks PLB arranged in rows and columns. Each interconnection line group ILG includes a plurality of interconnection lines ILA and ILB disposed respectively in a row direction (horizontal direction in FIG. 20) and a column direction (vertical direction in the FIG. 20). Switch matrixes SM are provided at the intersections of the interconnection line groups ILG (interconnection lines ILA and ILB). Each switch matrix SM includes a plurality of switching transistors as will be described later, and interconnection of the interconnection lines is established by programming the on/off states of such switching transistors, and also connection between the programmable logic block PLB and the interconnection lines ILA or ILB is established by the same programming.

FIG. 21 shows a specific structure of the switch matrix in FIG. 20. In FIG. 21, there is illustrated an arrangement of switching elements provided corresponding to the intersections of four horizonwise interconnection lines ILA0–ILA4 and four verticalwise interconnection lines ILB0–ILB3. Memory cells MCB shown in FIG. 21 are utilized for interconnecting programmable logic circuit blocks PLB and interconnection lines. FIG. 21 represents an exemplary mode of programming the on/off states of switching elements ST0–ST3 provided at the intersections of the interconnection lines ILB0–ILB3 and the input/output interconnection lines IOL connected to the input/output port of the programmable logic block PLB.

The memory cells MCA are so arrayed as to form a matrix, and one row of the memory cells MCB and one column of the memory cells MCB are disposed adjacent to each side of the matrix of such memory cells MCA. As a result, the memory cells MCA and MCB are arrayed in rows and columns to constitute a memory matrix. Word lines WL (WL0–WL5) are disposed corresponding to the rows of the memory matrix, and data lines (bit lines) BL (BL0–BL4) are disposed corresponding to the columns of the memory matrix. Switching elements SW are disposed correspondingly to the memory cells MCA. The on/off states of the switching elements SW are determined in accordance with storage data of the individual memory cells MCA correspondingly thereto respectively.

At the time of writing data in the memory cells MCA and MCB, one word line WL (out of WL0–WL5) is placed in a selected state, and then one row of the memory cells MCA or MCB are selected. Subsequently the data to be written in the selected memory cells MCA and MCB of one row are transmitted to the data lines BL0–BL4, and the data on the data line corresponding to such memory cells of one row are written therein. Thus, interconnections of the programmable logic blocks, i.e., signal propagation paths, are established by writing predetermined data in the memory cells MCA and MCB.

FIG. 22 illustrates an exemplary structure of the memory cell shown in FIG. 21. In FIG. 22, the memory cell MC (MCA or MCB) includes an access transistor NA of an n-channel MOS transistor (insulated gate type field effect transistor) which conducts in response to a signal potential on the word line WL to connect an internal node NDA to the data line BL, a first inverter IV1 for inverting and amplifying the signal potential on the internal node NDA and transmitting the amplified potential to an internal node NDB, and a second inverter IV2 for inverting and amplifying the signal potential on the internal node NDB and transmitting the amplified potential to the internal node NDA. Such inverters IV1 and IV2 constitute a latch circuit.

The first inverter IV1 includes a p-channel MOS transistor PM1 which is provided between a power supply node VDD and the internal node NDB and receives at its gate the signal potential on the internal node NDA, and an n-channel MOS transistor NM1 which is provided between the internal node NDB and a ground potential node GND and receives at its gate the signal potential on the internal node NDA. The second inverter IV2 includes a p-channel MOS transistor PM2 which is provided between the power supply node VDD and the internal node ND1 and receives at its gate the signal potential on the internal node ND2, and an n-channel MOS transistor NM2 which is provided between the internal node NDA and the ground potential node GND and receives at its gate the signal potential on the internal node NDB.

A word line selection signal from the address shift register AR (FIG. 19) is transmitted to the word line WL. A data signal from the data shift register DR (FIG. 19) is transmitted to the data line BL. The data shift register DR holds the data of one-row memory cell, and the address shift register AR drives the word lines WL sequentially into a selected state. When the signal potential on the word line WL has become a high ("H") level indicative of a selected state, the access transistor NA in the memory cell MC is switched on so that the internal node NDA is connected to the data line BL. Consequently the signal potential on the data line BL is transmitted as program data to the internal node NDA and then is latched by the inverters IV1 and IV2. After completion of writing the data, the potential on the word line WL is turned to a low ("L") level, so that the access transistor NA is switched off, and the signal potential on the internal node NDA is held by the inverters IV1 and IV2 as long as a predetermined potential is applied to the power supply node VDD and the ground potential node GND. The signal potential on the internal node NDB is applied to a gate terminal (control electrode) of the corresponding switching element SW or ST to thereby determine the on/off state of the corresponding switching element.

FIG. 23 shows an exemplary mode of programming a signal propagation path between two programmable logic circuit blocks. In FIG. 23, data "0" (corresponding to a low-level potential) is stored in memory cells M01–M02 (in the node NDB of FIG. 22), and data "1" (corresponding to a high-level potential) is written in the remaining memory cells M11–M15. Switching elements N01–N02 are turned off, while the remaining switching elements N11–N15 are turned on. The switching element N11 interconnects interconnection lines IL0 and IL1; switching elements N12 . . . N13 interconnect interconnection lines IL1 and IL2; and switching elements N14 . . . N15 interconnect interconnection lines IL2 and IL3. Therefore, the programmable logic circuit block PLBA is connected via the interconnection lines IL0, IL1, IL2 and IL3 to the programmable logic circuit block PLBB. The signal propagation path between the two programmable logic circuit blocks PLBA and PLBB is established by the storage data in the memory cells MC (M01, M02, M11–M15). The propagation path of the signal outputted from the logic circuit block PLBA can be changed by rewriting the storage data in the memory cells MC. That is, an interconnection network is reconstructible by the storage data in the memory cells MC, and in determining the specification of a trial product or the like, it becomes possible to determine an appropriate internal specification for attaining optimal performance characteristics.

FIG. 24 shows an equivalent circuit of the signal propagation path between the two logic circuit blocks in FIG. 23. In FIG. 24, switching elements N11–N1n are connected in series between the two logic circuit blocks PLBA and PLBB. A parasitic capacitance CL0 is associated to the interconnection line between the logic circuit block PLBA and the switching element N11. Similarly, parasitic capacitances CL1–CL(n–1) are present respectively on the signal interconnection lines between the switching elements, and a parasitic capacitance CLn is associated to the signal line between the switching element N1n and the logic circuit block PLBB. Memory cells M11–M1n are provided in correspondence to the switching elements N11–N1n respectively. A potential equal in level to the supply potential VDD is held in the internal node NDB of such memory cells M11–M1n. Here, the power supply node and the supply potential fed thereto will be described below with the same reference symbols.

An output buffer including an inverter circuit is provided in an output stage of the logic circuit block PLBA, and an input buffer including an inverter circuit is provided in the logic circuit block PLBB. When a signal is propagated from the logic circuit block PLBA to the logic circuit block PLBB, the signal propagation is delayed due to the internal resistances (on-resistances) of the switching elements N11–N1n and the parasitic capacitances CL0–C1n respectively on the signal interconnection lines, whereby it is rendered impossible to perform high-speed transmission of the signal to the logic circuit block PLBB. A voltage equal in level to the power supply potential VDD is transmitted to the control electrodes of the switching elements N11–N1n from the corresponding memory cells M11–M1n respectively. Each of the switching elements N11–N1n is comprised of an n-channel MOS transistor. Each n-channel MOS transistor is capable of transmitting, from a source to a drain, a voltage level (VDD–Vth) which is obtained by subtracting a threshold voltage Vth from the voltage applied to its gate. Therefore, in the arrangement of FIG. 24, the high ("H") level at the nodes ND1–NDn is equal to the voltage level lower by the threshold voltage Vth than the maximum power supply potential VDD, so that the high level of a signal can not full swing up to the power supply voltage VDD. Consequently, the voltage of the CMOS level can not be transmitted to the input buffer of the logic circuit block PLBB, and the p-channel MOS transistor in the input buffer can not be completely turned off, whereby there arises a problem that a through current flows therethrough to eventually bring about an increase of the current consumption.

As the distance from the logic circuit block PLBA becomes longer, the resistance R (derived from the switching element and the interconnection line) and the capacitance C (including the parasitic capacitance) in the signal line increase to consequently cause an RC delay, which raises a problem that the signal can not be changed fast and the rounding of the waveform is rendered great.

FIG. 25 graphically shows the result of simulating the signal waveform changes the node ND0 (output of the logic circuit block PLBA) and the node ND3 (input of the other logic circuit block PLBB) in an exemplary case where three switching elements (n=3) is connected in series to one another and the two logic circuit blocks PLBA and PLBB are mutually connected. In FIG. 25, the ordinate represents a voltage (V), while the abscissa represents a time (ns). As obvious from this graph, when a signal of 3.0 V (= VDD) is outputted from the logic circuit block PLBA, a high-level signal having an amplitude of 1.6 or so is transmitted to the input of the logic circuit block PLBB, and the waveform of the signal transmitted to the logic circuit block PLBB is greatly rounded. In particular, such rounding of the signal waveform is more conspicuous at a rise of the signal from a low level to a high level than at a fall thereof from a high level to a low level. This phenomenon is based on the fact that the capacitance is discharged fast, whereas the potential rise at the signal node by charging of the capacitance is relatively slow. When the power supply potential VDD is 3.0 V, as shown in FIG. 25, a high-level signal of 1.6 V or so is propagated to the input of the logic circuit block PLBB, whereby the p-channel MOS transistor of the input buffer in the logic circuit block PLBB is not fully turned off, and a through current comes to flow to cause a current consumption. In addition, it becomes difficult to make an accurate discrimination between a high level and a low level in the input buffer, hence bringing about a failure in a correct operation. There occurs another disadvantage that a fast operation cannot be ensured either due to the delay in the signal propagation.

As described above, in the conventional field programmable gate array having an advantage that signal propagation paths can be established merely by programming the storage data in SRAM (static random access memory) cells to thereby program the interconnection paths in an interconnection line network, there exists a problem that the delay in the signal propagation is rendered great in the interconnection lines where a multiplicity of switching elements are connected in series between two logic circuit blocks, and the signal propagation cannot be performed fast in the interconnection line network. Further the threshold voltage loss in the n-channel MOS transistors serving as switching elements increases relative to the logic level of a signal, in accordance with a reduction of the power supply potential VDD to 3 V or 1.5 V under the condition that the threshold voltage remains unchanged. In order to prevent the harmful influence resulting from drop of the threshold voltage in the switching element, it is necessary to equip a buffer circuit and so in the signal propagation path to boost the signal level on the signal line, hence raising another problem of an increase of the chip area.

SUMMARY OF THE INVENTION

It is an object of the present invention to provide a field programmable gate array which occupies a small area and is capable of propagating a signal at a high speed.

Another object of the invention is to provide a field programmable gate array capable of performing exact propagation of a signal without reducing the amplitude thereof.

A further object of the invention resides in providing a field programmable gate array which can eliminate any harmful influence caused by the threshold voltage or the like of MOS transistors serving as switching elements.

According to one aspect of the invention, a field programmable gate array comprises a plurality of logic blocks operating with voltages applied to a first power supply node and a second power supply node; a plurality of interconnection lines; a plurality of switching elements for establishing a signal propagation path between logic blocks by selectively interconnecting plural interconnection lines; and a plurality of memory cells each connected between a third power supply node and a fourth power supply node. Each memory cell stores data to determine an on/off state of a corresponding switching element and sets the corresponding switching element in an on/off state in accordance with the stored data.

The field programmable gate array further comprises voltage sources for supplying predetermined potentials to the first and second power supply nodes of the plural logic blocks; and voltage change means coupled to the voltage sources to change the voltages supplied thereto from the voltage sources, in such a manner that the difference between the changed voltages becomes greater than the absolute value of the difference between the voltages supplied to the first and second power supply nodes, and then supplying the changed voltages to third and fourth power supply nodes of the memory cells.

In this gate array, the absolute value of the difference between the voltages applied to the power supply nodes of the memory cells is set to be greater than the absolute value of the difference between the voltages applied to the power supply nodes of the logic circuit blocks. Since the voltage applied to the control electrode of the switching element is greater than the amplitude of the signal to be transmitted by the switching element, in case the switching element is comprised of a field effect transistor, the signal fed to the switching element can be propagated properly without being harmfully affected by any voltage drop caused due to the threshold voltage of the switching element, hence preventing any loss of the signal amplitude.

The foregoing and other objects, features, aspects and advantages of the present invention will become more apparent from the following detailed description of the present invention when taken in conjunction with the accompanying drawings.

DETAILED DESCRIPTION OF THE PREFERRED EMBODIMENTS

Figure 24:
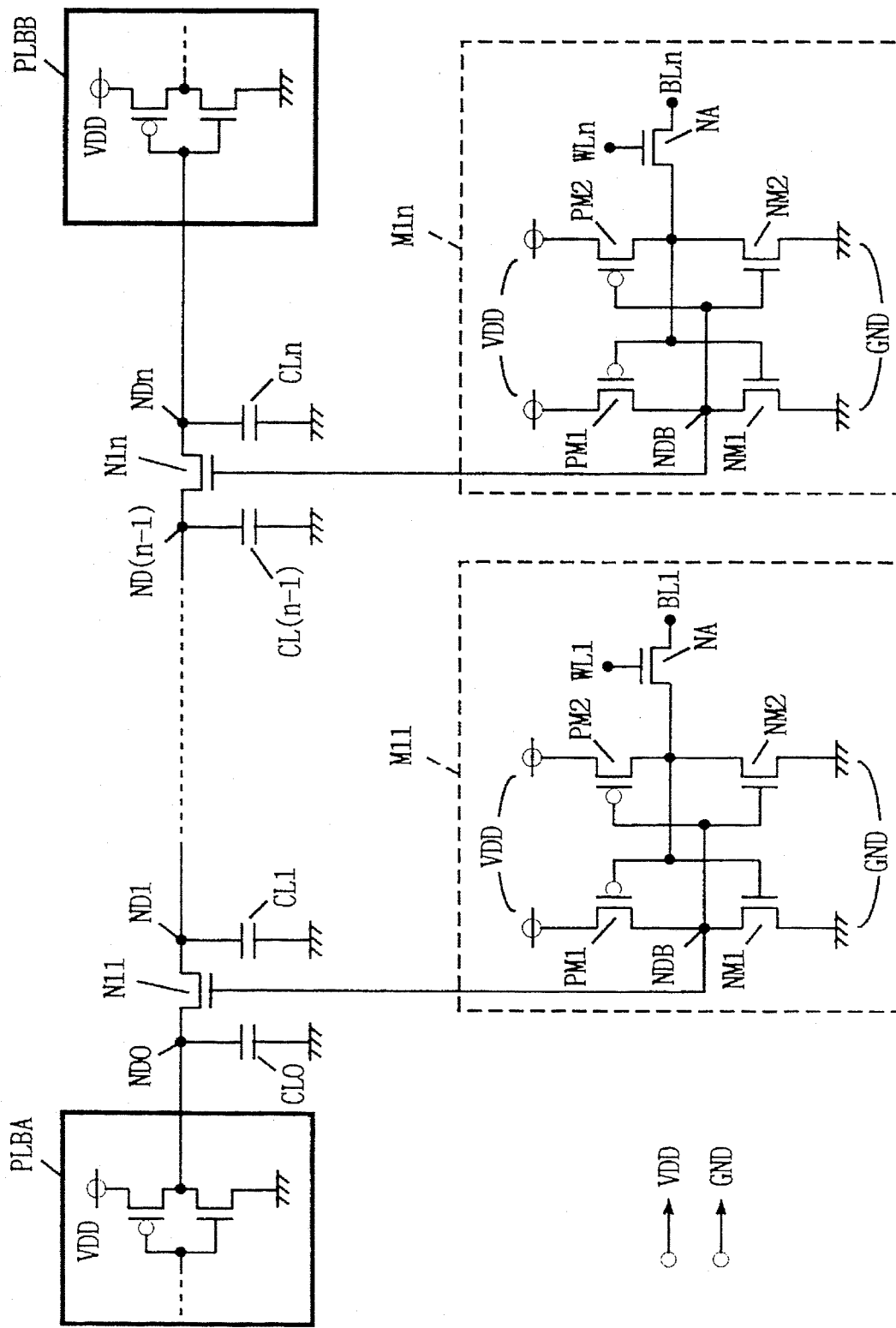
FIG. 24 shows an equivalent circuit after completion of programming a signal propagation path between two logic circuit blocks in the field programmable gate array.

In the following description, some exemplary constitutions corresponding to the constitution of the conventional field programmable gate array shown in FIG. 24 will be explained for the purpose of clearly distinguishing between the prior art and the present invention. However, it is to be noted that the present invention is applicable to any device where a signal propagation path between logic circuit blocks is established in accordance with storage data in memory cells. Therefore, in the following description, the field programmable gate array is defined as "a device including a plurality of logic circuit blocks and where at least a signal propagation path can be programmed by storage data in memory cells." "Logic circuit blocks" may be in a programmable constitution which can be reconstructed repeatedly by program data, and the logic constitution thereof may be set fixedly.

EMBODIMENT 1

Figure 1:
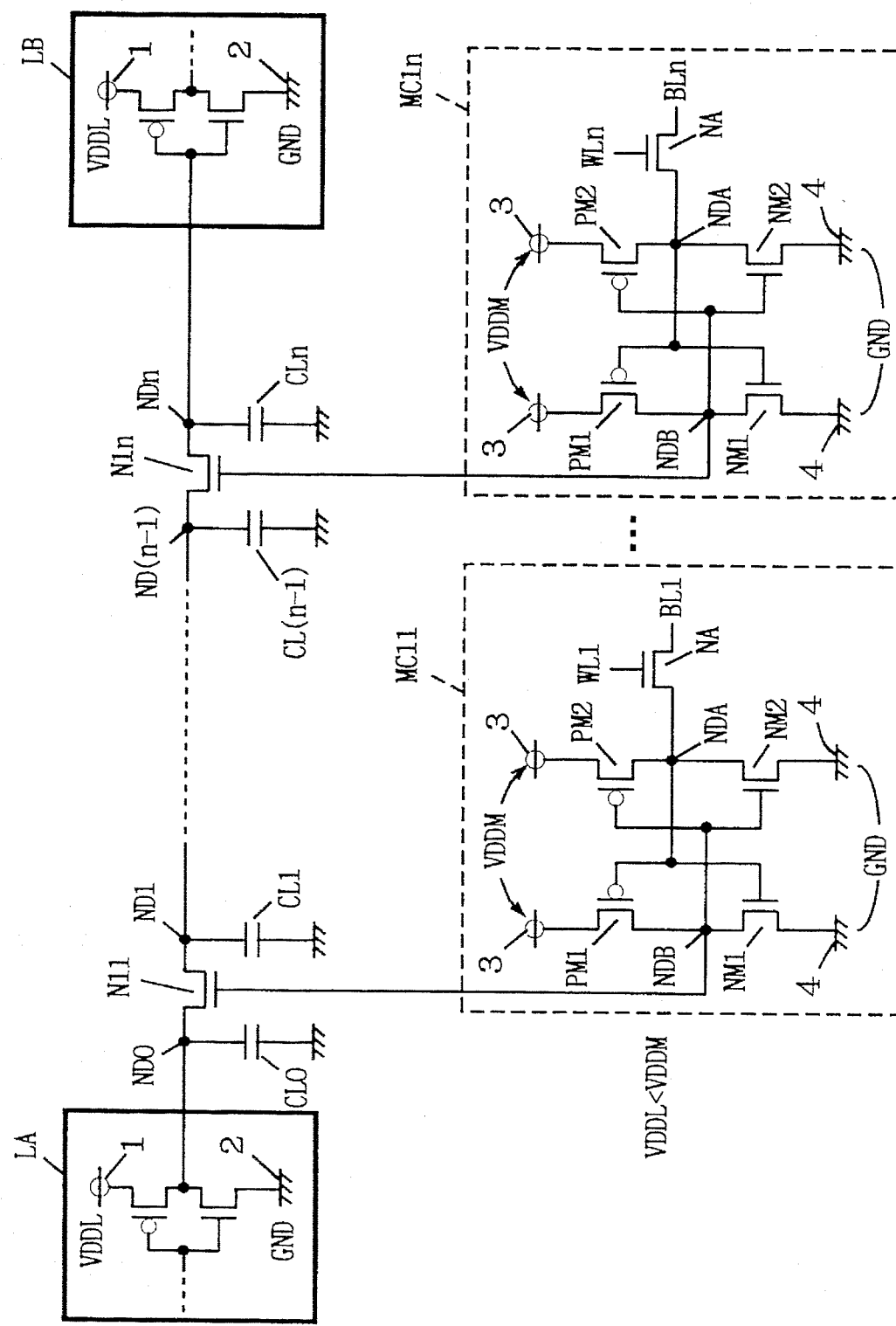
FIG. 1 shows a configuration of main portion in a field programmable gate array according to a first embodiment of the present invention.

FIG. 1 shows a configuration of a main portion of a field programmable gate array according to a first embodiment of the present invention. Referring to FIG. 1, the array includes switching elements N11–N1n disposed in a signal propagation path between logic circuit blocks LA and LB, and memory cells MC11–MC1n for controlling conduction/nonconduction (on/off state) of the switching elements N11–N1n.

In FIG. 1, a supply voltage VDDL is fed to a first power supply node in each of the logic circuit blocks LA and LB. In the figure, there are illustratively shown an output buffer of a CMOS inverter structure provided in an output stage of the logic circuit block LA, and an input buffer of a CMOS inverter structure provided in an input stage of the logic circuit block LB. The logic circuit block LA outputs a signal whose "H" (high) level is the supply voltage VDDL and whose "L" (low) level is the ground potential GND. The input logic threshold value of the logic circuit block LB may be a CMOS level or a TTL compatible level.

Each of the memory cells MC11–MC1n provided corresponding to the switching elements N11–N1n has an SRAM cell structure which is comprised of an inverter latch or a flip-flop. The memory cell MC11 is disposed at an intersection of a word line WL1 and a data line BL1, and the memory cell MC1n is disposed at an intersection of a word line WLn and a data line BLn. In each of the memory cells MC11–MC1n, a p-channel MOS transistor PM1 and an n-channel MOS transistor NM1 constitute one inverter, while a p-channel MOS transistor PM2 and an n-channel MOS transistor NM2 constitute another inverter. A supply voltage VDDM is fed to one power supply node 3 of the memory cells MC11–MC1n, while a ground potential GND is applied to another power supply node 4. The supply voltage VDDM fed to the power supply node 3 of the memory cells is set to a level higher than the supply voltage VDDL fed to the power supply node 1 of the logic circuit blocks LA and LB. The condition requisite for the supply voltage VDDM of the memory cells is VDDM≧VDDL+Vth, in which Vth denotes the threshold voltage of the n-channel MOS transistors serving as switching elements N11–N1n. Now the operation will be described below.

A high-level signal potential is held in the internal node NDB of each of the memory cells MC11–MC1n. More specifically, the internal node NDB is charged up to the level of the supply voltage VDDM fed to the power supply node 3 via the p-channel MOS transistor PM1. In this state, both the n-channel MOS transistor NM1 and the p-channel MOS transistor PM2 are turned off, while the n-channel MOS transistor NM2 is turned on, whereby the internal node NDA is held at the low level corresponding to the ground potential level.

It is assumed now that a high-level signal is outputted from the logic circuit block LA. An output buffer consisting of a CMOS inverter is provided in the output stage of the logic circuit block LA, so that a signal of the supply voltage VDDL fed to the power supply node 1 via the p-channel MOS transistor in the output stage is outputted as a high-level signal from the logic circuit block LA.

To the gates of the switching elements (n-channel MOS transistors N11–N1n), a high-level signal of the supply voltage VDDM is fed from the corresponding memory cells MC11–MC1n to thereby turn on the switching elements. Since the supply voltage VDDM for the memory cells is set to be sufficiently higher than the supply voltage VDDL for the logic circuit block, the signal of the supply voltage VDDL level from the logic circuit block LA is transmitted to the switching elements N11–N1n properly without any signal voltage loss. It is generally known that the relationship between a drain current and a gate voltage of a MOS transistor (insulated gate type field-effect transistor) is given by the following equations.

(1) In a non-saturation region where $|Vds|<|Vgs-Vth|Ids=K\cdot\{2(Vgs-Vth)\cdot Vds-Vds^2\}$ (2) In a saturation region where $|Vds|\geq|Vgs-Vth|:Ids=K\cdot(Vgs-Vth)^2$ In the above, K stands for a constant dependent on the gate width and the gate length of MOS transistor; Vth for the threshold voltage of the MOS transistor; Vds for the drain-source voltage of the MOS transistor; and Vgs for the gate-source voltage of the MOS transistor. When an n-channel MOS transistor is used as a switching element, its source is defined as a lower-potential conduction terminal (or a higher-potential one in the case of a p-channel MOS transistor). In accordance with a rise of the voltage applied to the gate of the n-channel MOS transistor serving as a switching element, as obvious from the above equations, the gate-source voltage Vgs also rises to increase the drain current Ids. That is, when the input signal is turned from a low level to a high level in each of the switching elements N11–N1n, the parasitic capacitances CL1–CLn present at the outputs thereof (node ND1–NDn) are charged fast so that the potential in the nodes ND1–NDn is raised quickly, whereby the signal turning from a low level to a high level can be propagated at a high speed from one logic circuit LA to the other logic circuit LB.

Figure 2:
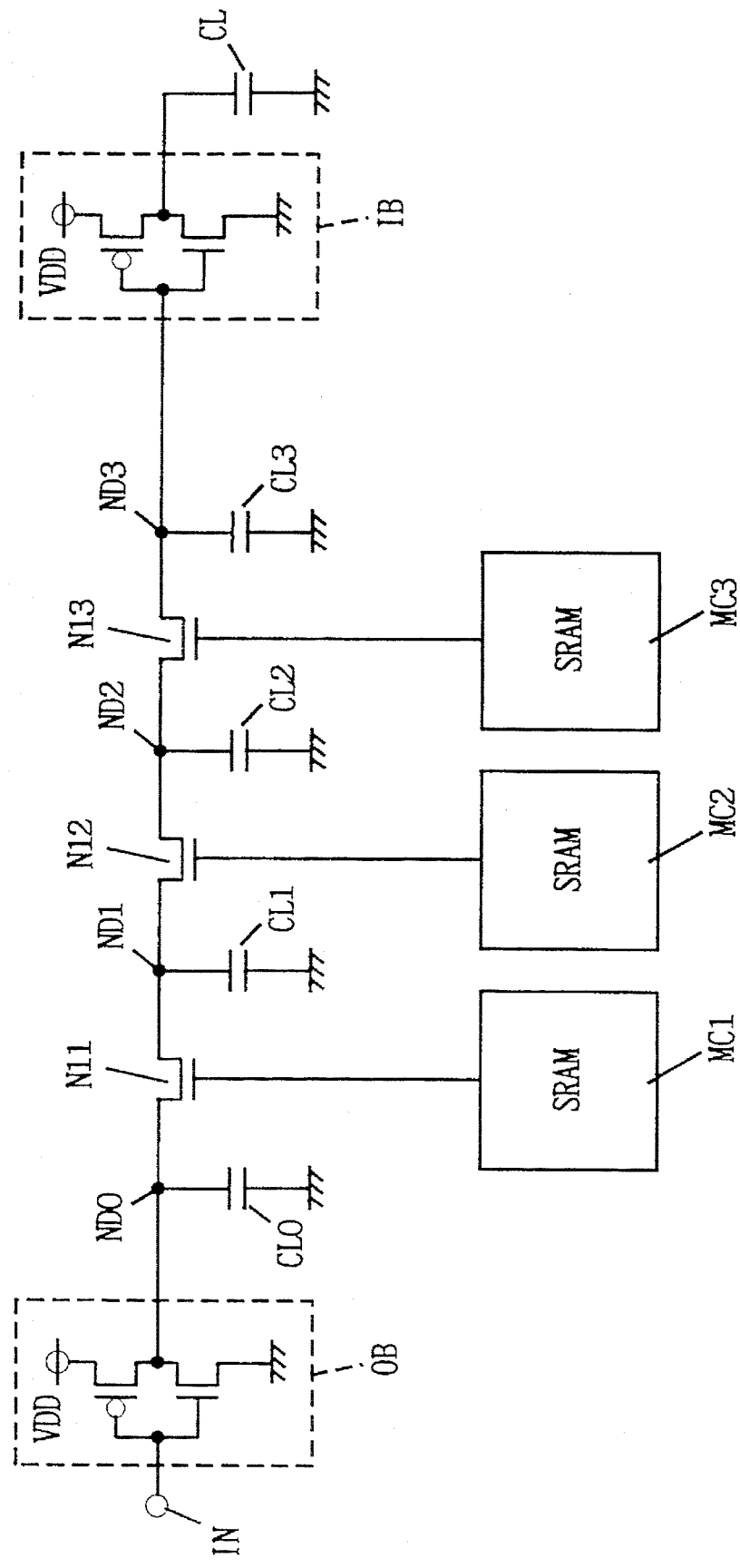
FIG. 2 shows a circuit model used in execution of a simulation to verify the effect of the field programmable gate array shown in FIG. 1.

FIG. 2 shows a circuit configuration used in the simulation executed for verifying the effects of the first embodiment mentioned above. In FIG. 2, there are provided an output buffer OB and an input buffer IB which represent logic circuit blocks. Three switching elements N11–N13 are connected in series between output buffer OB and input buffer IB. Further, SRAM cells (memory cells) MC1–MC3 are disposed corresponding to the three switching elements N11–N13.

Figure 3:
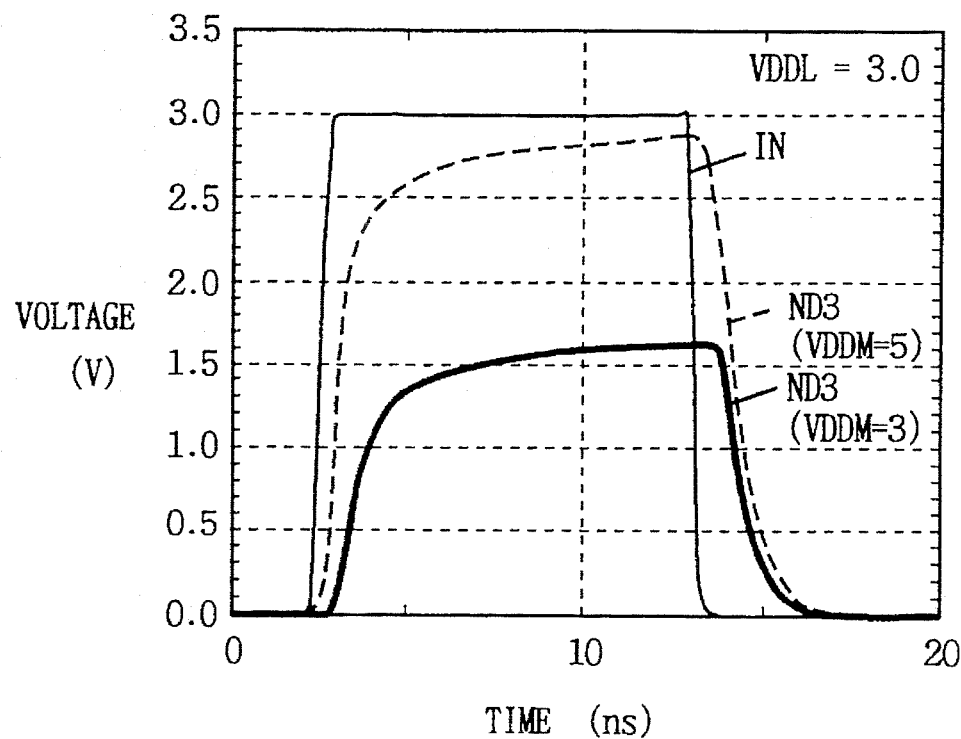
FIG. 3 graphically shows the result of the simulation executed by using the circuit model of FIG. 2.
Figure 25:
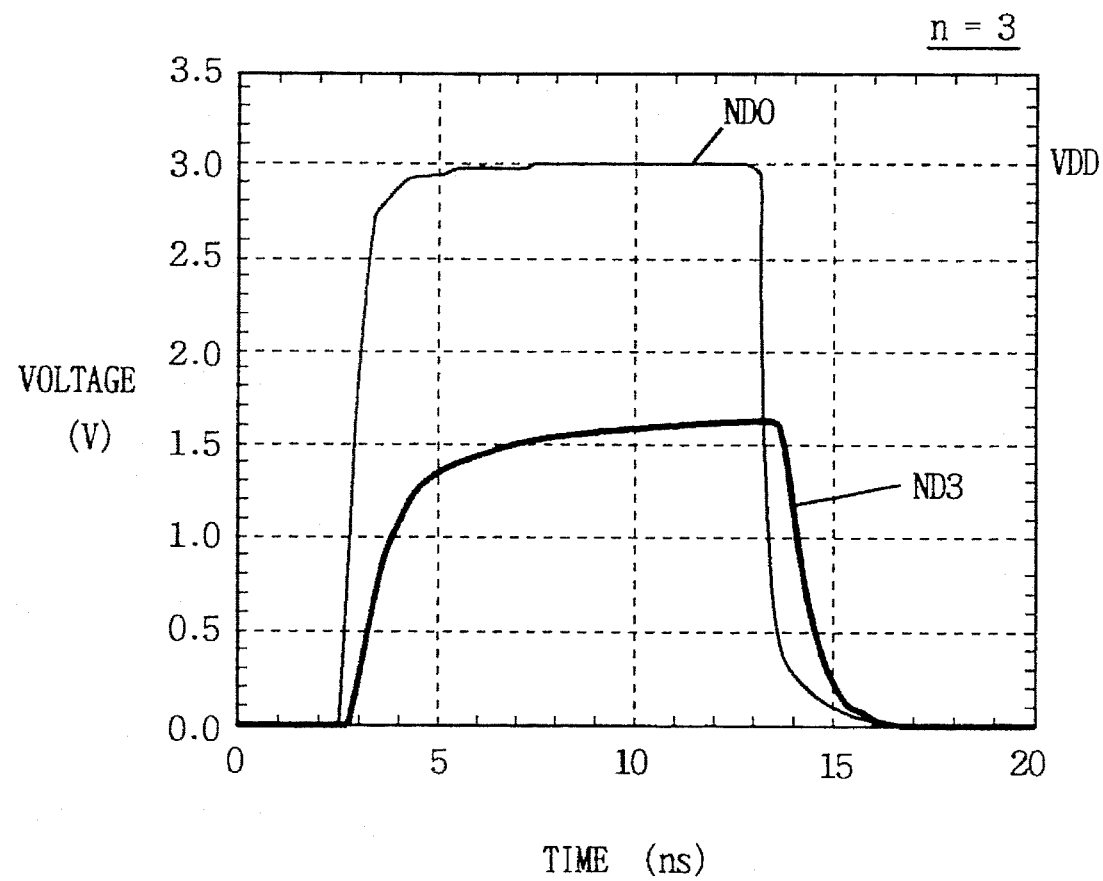
FIG. 25 graphically shows the result of simulating the performance characteristics of the conventional field programmable gate array.

FIG. 3 graphically shows the result of simulating a signal propagation path in FIG. 2. It is assumed in FIG. 3 that each of line capacitances CL0–CL3 is 0.4 pF. Supply voltages are set in two cases, i.e., one case where VDDL=VDDM=3.0 V (as in the conventional example of FIG. 25), and the other case where VDDL=3.0 V and VDDM=5.0 V. There are shown signal waveforms obtained when an input signal IN fed to the input of the output buffer IB is transmitted to the node ND3. In FIG. 3, the abscissa and the ordinate represent a time (ns) and a voltage (V), respectively. As obvious from FIG. 3, when the supply voltage VDDM for the memory cells is set to be higher than the supply voltage VDDL for the input buffer IB and the output buffer OB, the signal can be propagated without harmful affect by the threshold voltage loss at the switching elements N11–N13, whereby the rate of the signal amplitude loss is minimized. It is also observed that the rise of the signal waveform is sharper than that in the conventional example (VDDM=3.0 V=VDDL) of the prior art.

In the result of the simulation shown in FIG. 3, if the supply voltage VDDM for the memory cells is set to be further higher, it becomes possible to raise the signal potential in the node ND3 up to the supply voltage VDDL for the memory circuit block.

In this field programmable gate array, each memory cell for determining the on/off state of the corresponding switching element includes an SRAM cell. The SRAM cell operates merely at the time of programming an interconnection line network, i.e., only when data is written in the SRAM cell. During the operation of the logic circuit, the access transistor NA is kept in its off-state, and the SRAM cell statically holds the signal potential written therein. At this time, a latch circuit is formed of a CMOS inverter in the SRAM cell, so that no through current is caused to flow, and therefore current consumption is approximately zero. Consequently, even if the supply voltage VDDM for the memory cells is set to be high, there occurs substantially no increase in the consumed current during "chip operation" in which the logic circuits are driven.

The signal propagation delay in the interconnection line path can be reduced by sufficiently raising one power supply voltage VDDM for the memory cells without causing an increase of the whole power consumption in the field programmable gate array during the chip operation, whereby it is rendered possible to realize a high-speed field programmable gate array. Furthermore, due to such selective utilization of a sufficiently high voltage as the memory-cell supply voltage VDDM, the signal potential on an interconnection line node can be fully swung between the supply voltage VDDL for the logic circuit block and the ground potential to thereby ensure an accurate circuit operation.

SUPPLY VOLTAGE DISTRIBUTION 1

Figure 4:
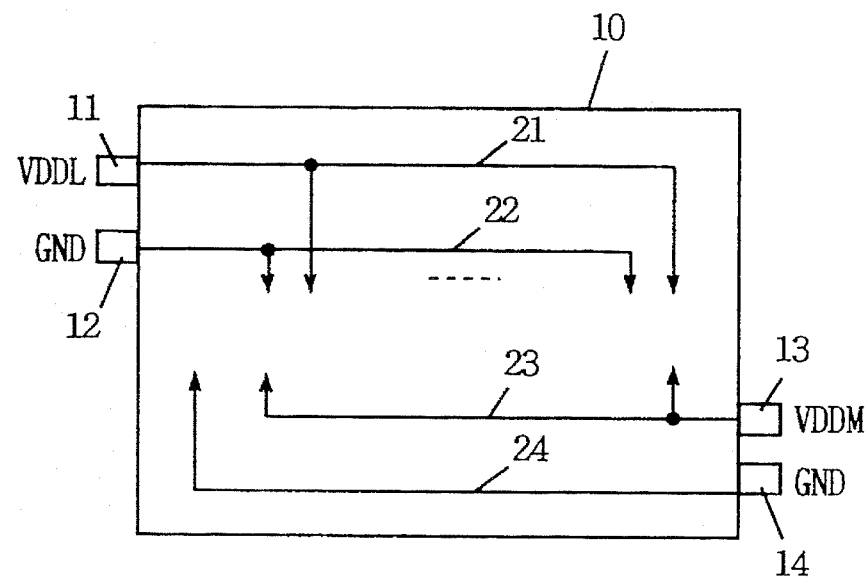
FIG. 4 schematically shows a constitution of supply voltage distribution utilized in the first embodiment.

FIG. 4 schematically shows an exemplary supply voltage distribution used in the first embodiment. The field programmable gate array is formed on a semiconductor chip (or substrate region) 10. On one side of the semiconductor chip 10, there are provided a terminal (or node) 11 for inputting the logic-circuit supply voltage VDDL and a terminal (or node) 12 for supplying the ground potential GND to the logic circuit block. On the other side of the semiconductor chip 10, terminals (or nodes) 13 and 14 are provided for inputting the memory-cell supply voltage VDDM and the ground potential GND. The logic-circuit supply voltage VDDL fed to the terminal 11 is transmitted via a power line 21 to the logic circuit blocks provided inside, while the ground potential GND applied to the terminal 12 is transmitted via an internal power line 12 to the other power supply node 2 for the logic circuit blocks.

The memory-cell supply voltage VDDM fed to the terminal 13 is transmitted via an internal power line 23 to one power supply node 3 for the memory cells. The ground potential GND applied to the terminal 14 is transmitted via an internal power line (ground line) 24 to the memory-cell ground potential node 4.

As shown in FIG. 4, the power lines 21 and 22 for transmitting the supply voltages to the logic circuit blocks are provided separately from the power lines 23 and 24 for transmitting the supply voltages to the memory cells, so that the data (signal potential) to be stored in each memory cell is not changed despite generation of any noise on the power lines 21 and 22 and the resultant variation of the internal supply voltage during the operation of the logic circuit, i.e., during the chip operation, and therefore the fixed-level voltage can be supplied stably to the control electrode of the switching element (the gate electrode of the MOS transistor), hence maintaining the operation characteristics of the switching elements in the desired state.

SUPPLY VOLTAGE DISTRIBUTION 2

Figure 5:
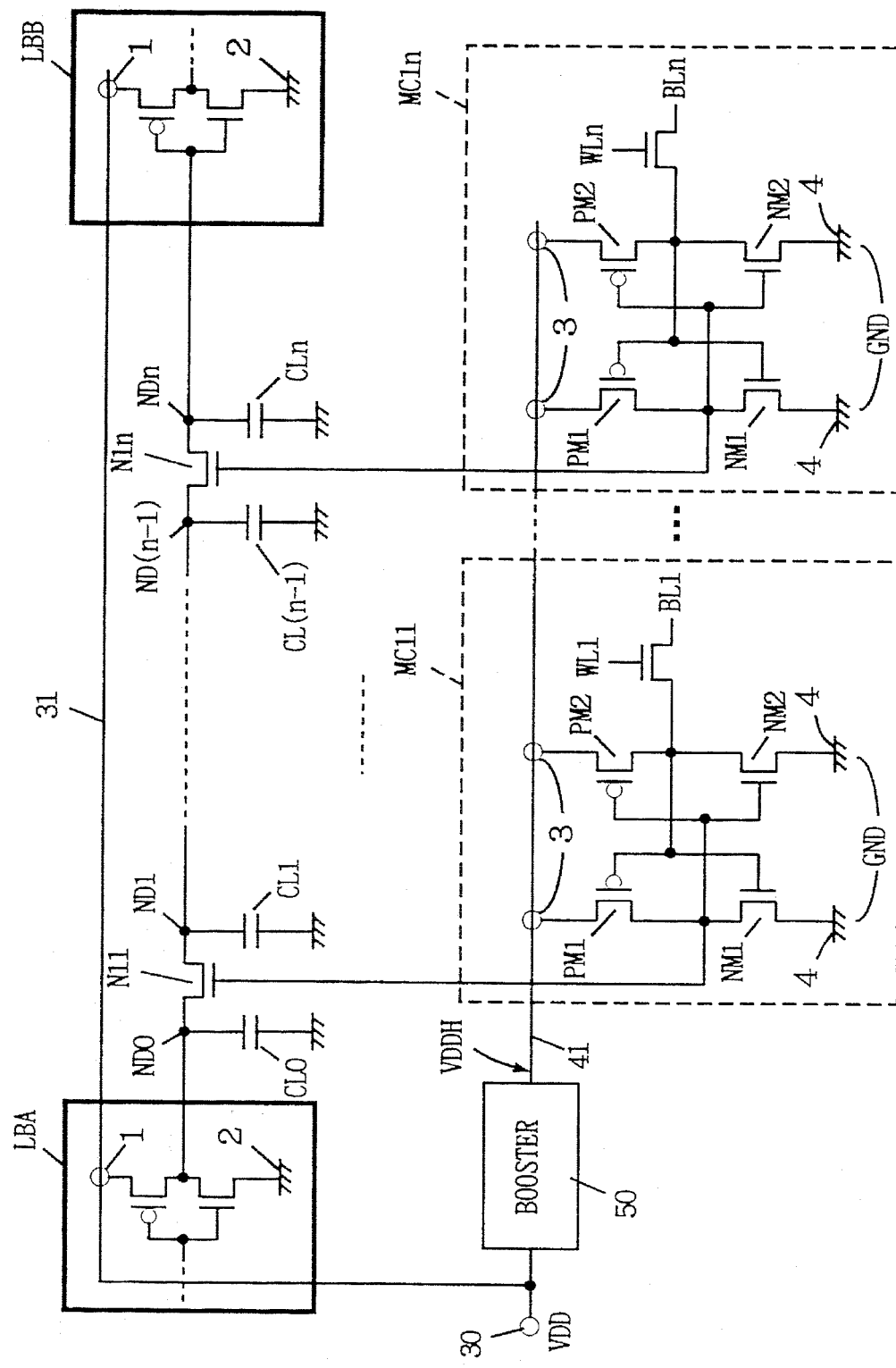
FIG. 5 shows a constitution of a first modification of the first embodiment of the present invention.

FIG. 5 shows a second arrangement of a supply voltage distribution employed in the first embodiment. In FIG. 5, a booster circuit 50 is provided for boosting a supply voltage VDD fed to a power input terminal (node) 30 and transmitting a boosted voltage VDDH via a power line 41 to a power supply node 3 of memory cells (MC11–MC1n). The supply voltage VDD fed to the power input terminal 30 is transmitted via another power line 31 to logic circuit blocks LBA and LBB at a power supply node 1. Although the internal configuration of the booster circuit 50 will be described later, this circuit utilizes, e.g., a charging pump action for generating a boosted voltage. In the configuration of FIG. 5, the boosted voltage VDDH is produced from the supply voltage VDD fed to the power input terminal 30, so that the number of terminals (nodes) required for inputting the power is reduced to consequently diminish the area needed for such power input terminals, hence achieving a reduction of the entire chip area.

Figure 6:
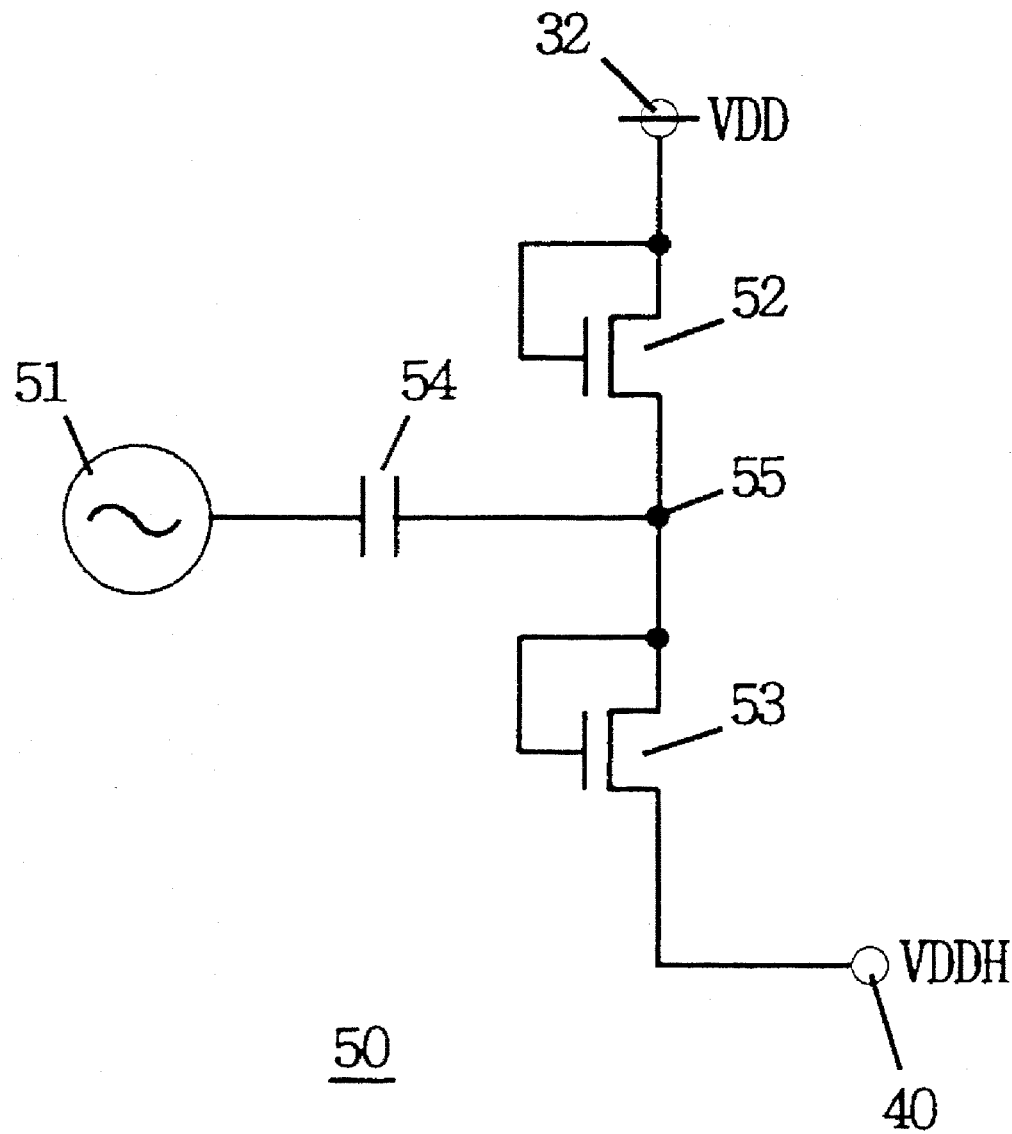
FIG. 6 shows an exemplary configuration of a booster circuit included in FIG. 5.

FIG. 6 shows an exemplary configuration of the booster circuit included in FIG. 5. The configuration of the booster circuit shown in FIG. 6 is disclosed in, e.g., Inoue et al., "Optimal Configuration of Sense Circuit for Dynamic MOS Memory," (Shingaku Giho (Institute of Electronics Communications and Electric Engineers Technical Report, Vol. SSD 80–44, pp. 69–76, FIG. 12, 1980).

In FIG. 6, the booster circuit 50 comprises an oscillator 51 which performs oscillation in a predetermined cycle and produces a pulse output of a predetermined pulse width, a capacitor 54 to perform a charging pump action in response to the pulse signal outputted from the oscillator 51, a diode-connected n-channel MOS transistor 52 whose gate and drain are connected to a power supply node 32 and whose source is connected to a node 55, and a diode-connected n-channel MOS transistor 53 whose gate and drain are connected to a node 55 and whose source is connected to a node 40. A supply voltage VDD fed to the chip power input node (FIG. 5) is transmitted to a node 32. The node 40 is connected to the power line 41 shown in FIG. 5 and outputs a boosted voltage VDDH. Now, the operation will be briefly described below.

Assume now that the node 55 is at a potential of VDD–Vth, in which Vth denotes the threshold voltage of the MOS transistors 52 and 53. In this state, when the pulse signal outputted from the oscillator 51 rises to a high level, positive charge is injected into the node 55 by the charging pump action of the capacitor 54, hence raising the potential at the node 55. In the case the potential at the node 40 is lower than the potential at the node 55, the MOS transistor 53 is turned on so that positive charge flows from the node 55 to the node 40, whereby the potential at the node 40 is raised. When the pulse signal outputted from the oscillator 51 falls to a low level, the potential at the node 55 is lowered by the charging pump action of the capacitor 54, hence turning off the MOS transistor 53. At this time, the MOS transistor 52 is turned on so that the potential at the node 55 is raised up to VDD–Vth by the charging. Subsequently the above operation is repeated, and the MOS transistor 53 is turned on whenever the potential at the node 55 is raised by the charging pump action of the capacitor 54, hence raising the potential at the node 40. The final potential obtained at the node 40 is determined by both the capacitance of the capacitor 54 and the oscillation frequency and the pulse width of the oscillator 51, and the voltage VDDH is maximally raised up to a potential level of 2 (VDD–Vth).

In the configuration where the memory-cell supply voltage VDDH is generated internally by the use of such booster circuit, the power consumption is slightly increased in comparison with the arrangement of FIG. 4 due to the operation of the booster circuit 50, but the effects attainable with regard to the fast operation characteristic and the signal amplitude are the same as those in the arrangement of FIG. 4. In the case of generating the memory-cell supply voltage internally by using the booster circuit, the number of required power input terminals (nodes) can be reduced as the terminals (nodes) are provided in common to both the logic circuit blocks and the memory cells.

MODIFICATION OF FIRST EMBODIMENT

Figure 7:
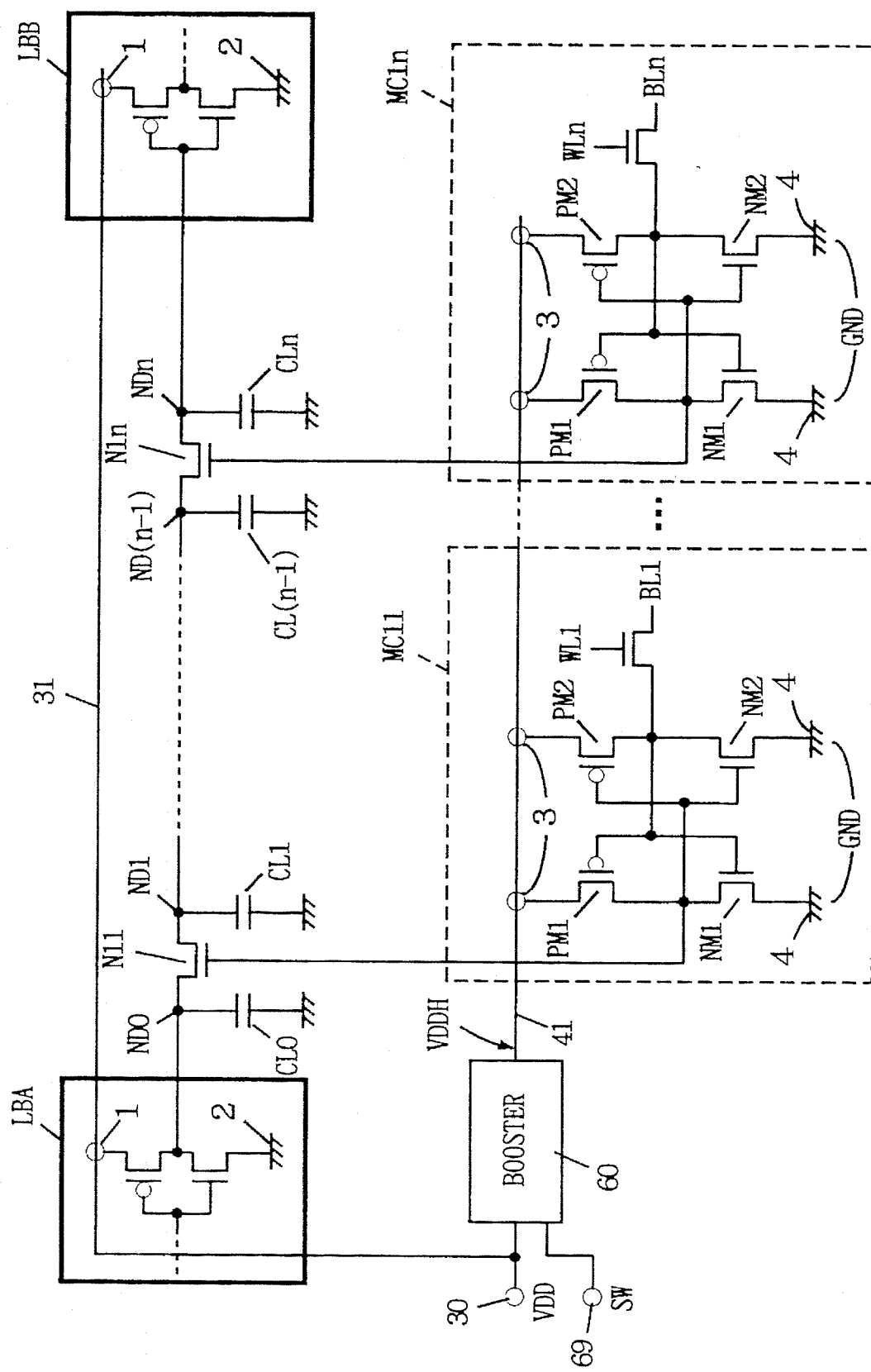
FIG. 7 shows a constitution of a second modification of the first embodiment of the invention.

FIG. 7 shows a constitution of a modification of the first embodiment of the invention. In the constitution of FIG. 7, a booster circuit 60 for producing a memory-cell supply voltage VDDH by boosting a supply voltage VDD fed to a power input terminal 30 further receives an operation mode instruction signal SW. The booster circuit 60 performs its boosting operation only when the operation mode instruction signal SW is in an active state and, to generate and feed a boosted voltage VDDH higher than the supply voltage VDD, to a memory-cell supply node 3. When the operation mode instruction signal SW is in an inactive state, the booster circuit 60 halts its boosting operation. Although the configuration of this booster circuit 60 will be described in detail later, the operation of the oscillator is brought to a halt state during the halt of the boosting operation.

In an interconnection program mode to write interconnection program data in memory cells MC11–MC1n and also in a standby mode prior to "chip operation" where the chip is placed in operation state processing data fed thereto, it is not particularly necessary to apply the boosted voltage stably to the control electrode of any switching element (gate electrode of MOS transistor). Therefore, unnecessary power consumption can be prevented by turning the operation mode instruction signal SW to an inactive state to thereby halt the boosting operation of the booster circuit 60, hence suppressing the current consumption during chip non-operation (in the standby mode and the interconnection program mode) to consequently realize reduction of the consumed power.

Figure 8:
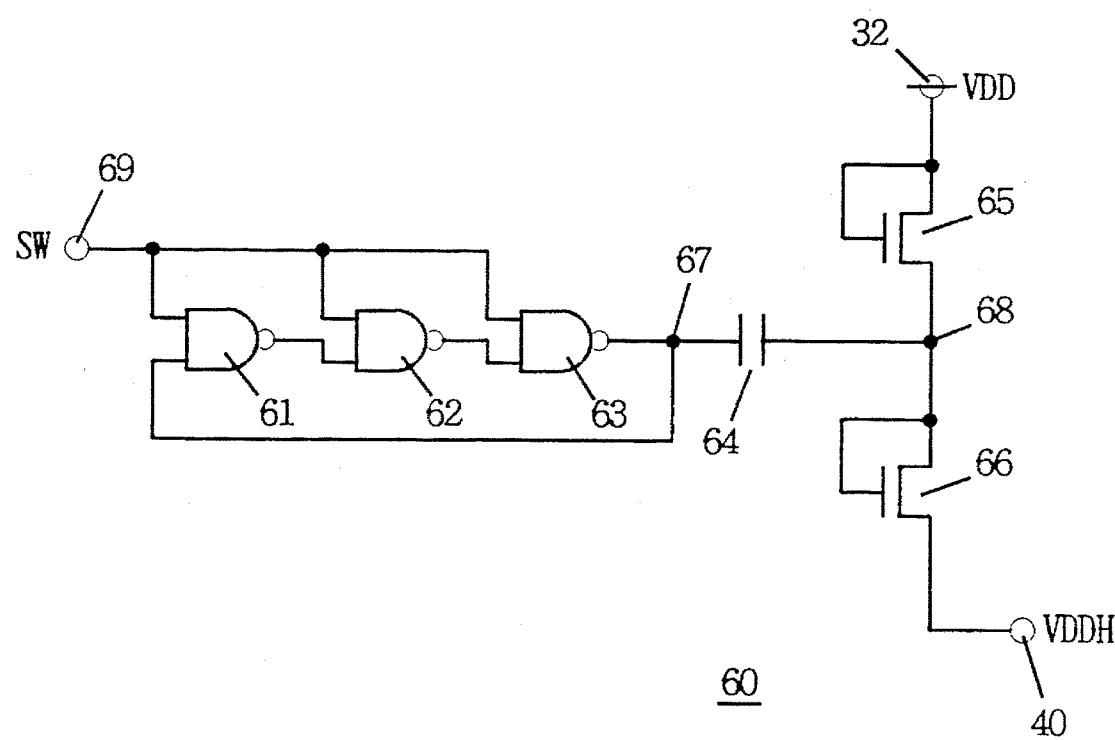
FIG. 8 shows an exemplary configuration of a booster circuit included in FIG. 7.

FIG. 8 shows an exemplary configuration of the booster circuit included in FIG. 7. Referring to FIG. 8, the booster circuit 60 includes two-input NAND circuits 61, 62 and 63 disposed in three stages to constitute an oscillator; a capacitor 64 fed with the output of the NAND circuit 53; a diode-connected n-channel MOS transistor 65 provided between a power supply node 32 and an internal node 68; and a diode-connected n-channel MOS transistor 66 provided between the internal node 68 and a supply voltage output node 40. The power supply node 32 is coupled to the supply voltage input node 30 shown in FIG. 7. The supply voltage output node 40 is connected to the supply voltage interconnection line 41 shown in FIG. 7.

Each of the NAND circuits 61 and 62 receives, at its one input, an operation mode instruction signal SW fed to a terminal 69, while receiving the output of the NAND circuit 63 or 61 at its other input. The NAND circuit 63 receives, at its one input, the operation mode instruction signal SW applied to the terminal 69, while receiving the output of the NAND circuit 62 at its other input. When the signal SW is at a low level corresponding to an inactive state, each output of the NAND circuits 61, 62 and 63 is at a high level. In this case, the potential at the node 67 is fixed at a high level, so that the capacitor 64 does not execute a charging pump action and therefore the potential at the node 68 is held by the MOS transistor 65. Since the oscillator comprised of the NAND circuits 61 to 63 performs no oscillation, no power consumption is caused during this period (in which the node 68 is at a high potential level slightly lowered by the leakage current at the node 40).

When the signal SW is turned to a high level corresponding to an active state, the NAND circuits 61–63 each function as an inverter. More specifically, the NAND circuits 61–63 form a ring oscillator comprised of three-stage inverters, and the potential at the node 67 oscillates between a high level and a low level cyclically in a period determined by the delay times of the NAND circuits 61–63. Consequently the capacitor 64 executes the charging pump operation. The boosting operation for producing the memory-cell supply voltage VDDH from the supply voltage VDD is the same as that of the aforementioned booster circuit shown in FIG. 6.

Due to the use of the circuit configuration shown in FIG. 8, it becomes possible to selectively inhibit the boosting operation of the booster circuit in accordance with the operation mode instruction signal SW, hence realizing a reduction of the current consumption.

In the booster circuit of FIG. 8, a ring oscillator is constituted of NAND circuits connected in three stages. However, the stages of such NAND circuits included in the ring oscillator may be any odd number.

In the case the switching elements for connection of interconnection lines are comprised of p-channel MOS transistors, similar effects can also be achieved if the on/off control data transmitted from the memory cells is at a negative potential level. In this case, the circuit configuration may be so altered that a negative potential is applied, instead of the ground potential, to the other power supply node 4 of the memory cells.

EMBODIMENT 2

Figure 9:
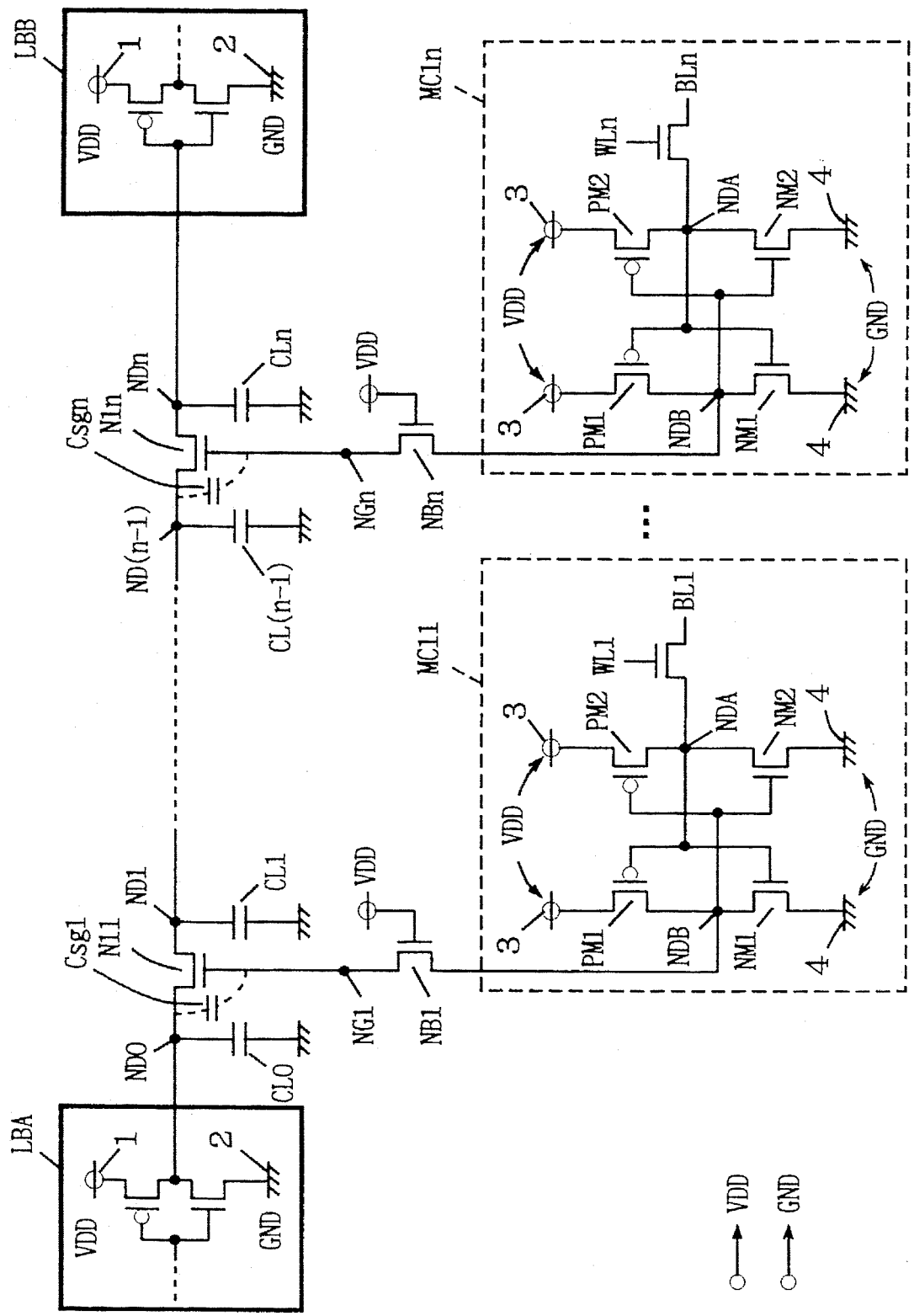
FIG. 9 shows a configuration of main portion in a field programmable gate array according to a second embodiment of the invention.

FIG. 9 shows a configuration of a main portion of a field programmable gate array according to a second embodiment of the present invention. In the constitution of the second embodiment shown in FIG. 9, there are included series-connected switching elements N11–N1n which form a signal propagation path between logic circuit blocks LBA and LBB, memory cells MC11–MC1n disposed corresponding to such switching elements N11–N1n, and n-channel MOS transistors NB1–NBn disposed between the switching elements N11–N1n and the memory cells MC11–MC1n to serve as separation means. More specifically, the n-channel MOS transistors NB1–NBn are provided respectively between internal nodes NDD of the memory cells MC11–MC1n and control electrodes of the switching elements N11–N1n (gate electrodes of the MOS transistors), and receive a supply voltage VDD at the respective gates. To power supply nodes 1 and 2 of the logic circuit blocks LBA and LBB, there are fed the supply voltage VDD and the ground potential GND respectively. Also to power supply nodes 3 and 4 of the memory cells MC11–MC1n, there are similarly fed the supply voltage VDD and the ground potential GND respectively. Now the operation will be described below.

A signal potential of the level corresponding to the supply voltage VDD is outputted from the internal node NDB of the memory cells MC11–MC1n. The separating MOS transistors NB1–NBn receive the supply voltage VDD at the gates thereof and transmit the voltage of the (VDD–Vth) level to the corresponding switching elements N11–N1n. Denoted by Vth is the threshold voltage of the separating MOS transistors NB1–NBn. When the potential at gate nodes NG1–NGn of the switching elements N1–N1n has reached the (VDD–Vth) level, the separating MOS transistors NB1–NBn are substantially turned off since the source-gate potential difference is equal to the threshold voltage, whereby the gates (nodes ND1–NDn) of the switching elements N11–N1n are separated from the output node LDB of the memory cells MC11–MC1n. The term "separation" used here signifies that the capacitance between the gates of the switching elements N (N11–N1n) corresponding to the MOS transistors NB (NB1–NBn) is separated from the parasitic capacitance present on the interconnection lines between the nodes NDB of the memory cells MC (MC11–MC1n) and corresponding MOS transistors NB (NB1–NBn), but the electrical connection therebetween is maintained. That is, when the potential at the nodes ND (ND1–NDn) has lowered, charging is performed via the MOS transistors NB.

When a high-level signal is outputted from the logic circuit block LBA, first parasitic capacitance CL0 at the node ND0 is charged, so that the potential at the node ND0 is raised. Since a capacitance Csg1 is existent between the gate and the source of the switching element N11, the potential at the node ND1 is also raised (by self-boost action of MOS transistor) due to the capacitance Csg1 simultaneously with the potential rise at the node ND0. Upon rise of the potential at the node ND1, the potential at the drain of the MOS transistor ND1 (conduction terminal connected to the node NDB) has the level corresponding to the supply voltage VDD, whereby the MOS transistor NB1 is completely turned off and the node NG1 is placed in an electrically floating state, so that the raised potential at the node NG1 is held. Consequently, the conductance of the switching element N11 is increased to thereby permit a flow of greater drain current, and therefore the parasitic capacitance CL1 existent at the output node ND1 is charged fast. Such self-boost action done in the switching element N11 is executed sequentially in the succeeding switching elements as well.

When the potential at the node NGn is raised through the capacitive coupling by the gate-source capacitance Csgn in the final-stage switching element N1n, the potential at the node NDn is also raised due to the fast charging executed via the switching element N1n in accordance with the potential at the node ND(n–1). As a result of such sequential self-boost action of the switching elements N11–N1n, the signal can be propagated fast from one logic circuit block LBA to the other logic circuit block LBA. Since the gate potential in any of the switching elements N11–N1n is thus raised, it becomes possible to suppress the amplitude loss of the high-level signal, as in the foregoing first embodiment.

When the signal outputted from the logic circuit block LBA is turned from a high level to a low level, the gate potential in each of the switching elements N11–N1n is changed through the capacitive coupling, but the changed potential in the switching elements N11–N1n is charged fast up to the level of the supply voltage VDD Vth due to the charging executed via the separating MOS transistors NB1–NBn corresponding thereto, so that the gate potential is maintained approximately at a fixed value. In other words, no delay is caused at all in the signal propagation even when a low-level signal is outputted from the logic circuit block LBA.

Figure 10:
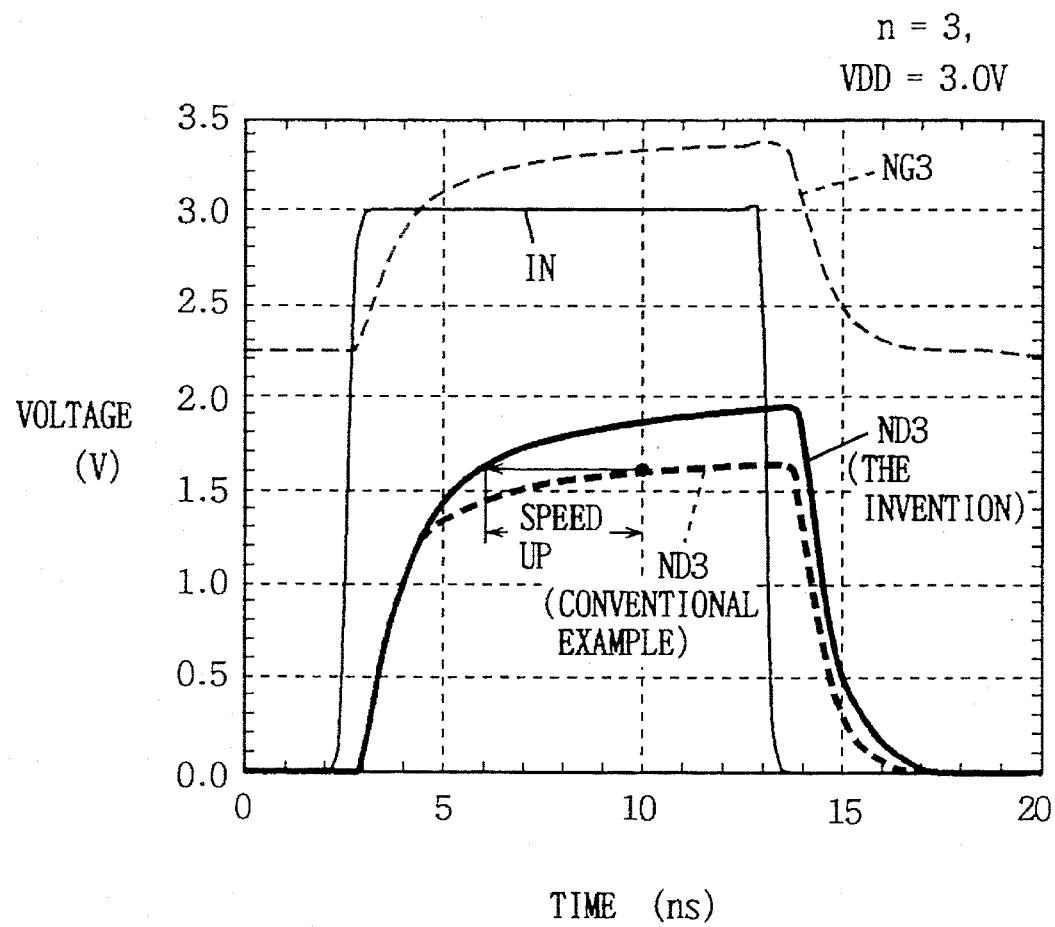
FIG. 10 graphically shows the result of simulating the operation of the second embodiment of the invention.

FIG. 10 graphically shows the result of simulating the circuit operation with three switching elements.

The conditions in the simulation are the same as those given with regard to FIG. 2 simulation. In FIG. 10, the ordinate and the abscissa represent a voltage (V) and a time (ns), respectively. Reference symbols attached to the characteristic curves signify an input signal IN and nodes where signal potential changes are caused.

In the present invention, as obvious from FIG. 10, the high-level potential at the node ND3 is made greater than the value in the prior art, and the loss of the signal amplitude is suppressed. Such suppression of the signal amplitude loss is brought by the potential rise induced at the node NG3 due to the self-boost action in the switching element N13.

In FIG. 10, the rise rate of the signal from a low level to a high level remains substantially the same in both the present invention and the prior art. However, when the high-level decision level in the logical circuit block LBB is 1.6 V for example, the time required for arrival at the high level is about 10 ns in the prior art, while it is about 6 ns in the present invention. Consequently, in the logic circuit block LBB, it becomes possible to make a decision of the high-level signal at an increased speed to eventually ensure faster propagation of the high-level signal. In the present invention where the high level is raised beyond 1.6 V, the p-channel MOS transistor in the input buffer of the logic block can be rapidly turned off to thereby reduce the through current.

The requirement to be satisfied here is merely that the voltage fed to the power supply node 3 of the memory cells MC11–MC1n and the voltage fed to the gates of the separating MOS transistors NB1–NBn should be equal to each other, and the aforementioned constitution of utilizing two supply voltages in the first embodiment may be applied to the second embodiment as well.

In the second embodiment, as described above, MOS transistors are provided in the path through which the output of each memory cell is transmitted to the control electrode of the corresponding switching element, so that during propagation of a signal turned from a low level to a high level, the gate potential of the switching element is raised by the self-boost action thereof. Consequently, the drain current supplied from each switching element is increased to realize faster propagation of the signal, hence reducing the delay and the signal amplitude loss in the propagation of the signal turned from a low level to a high level.

EMBODIMENT 3

Figure 11:
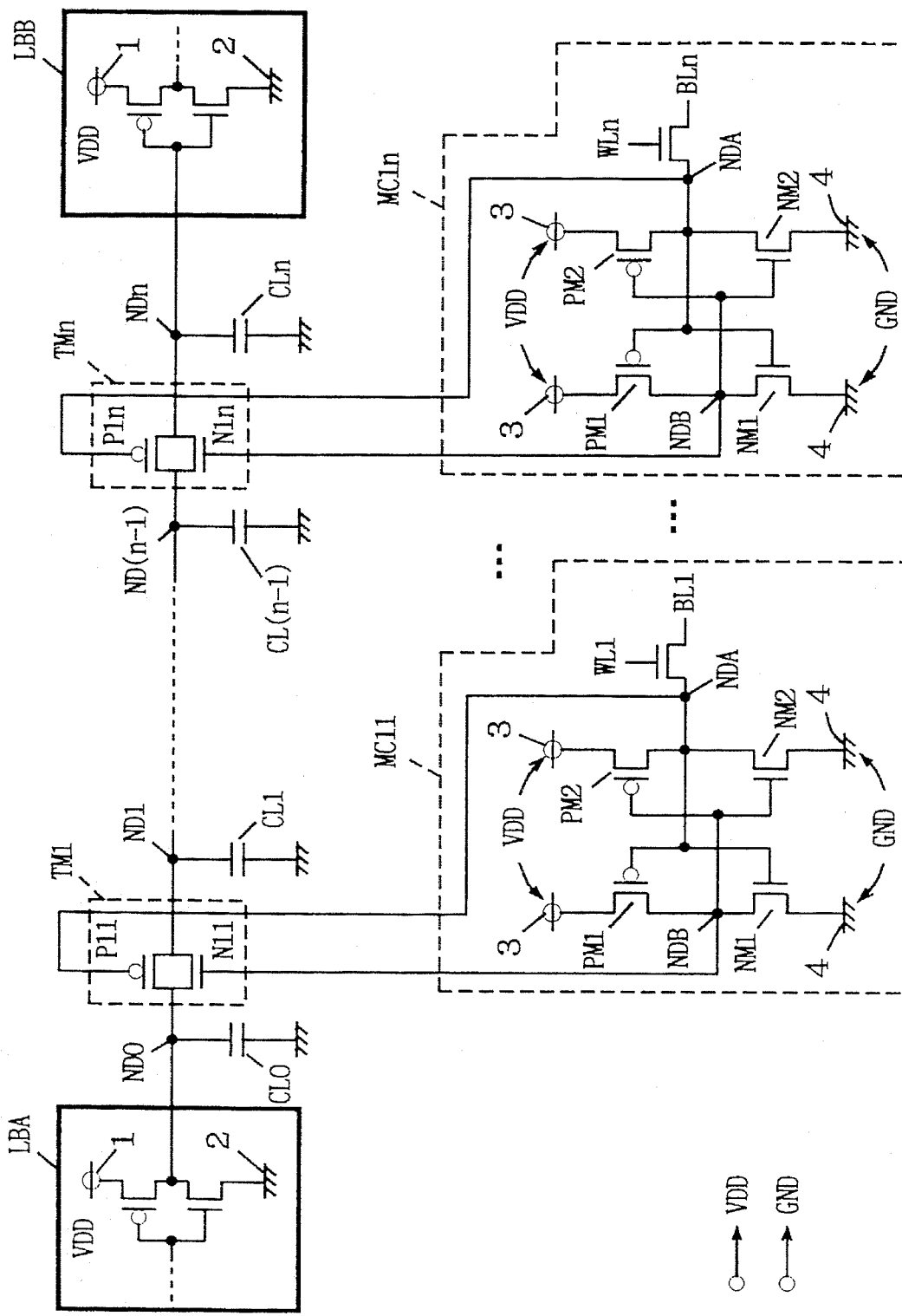
FIG. 11 shows a configuration of a main portion of a field programmable gate array according to a third embodiment of the invention.

FIG. 11 shows a configuration of a main portion of a field programmable gate array according to a third embodiment of the present invention. In the third embodiment of FIG. 11, transmission gates TM1–TMn are employed to serve as switching elements for establishing a signal propagation path between logic circuit blocks LBA and LBB. Each of the transmission gates TM1–TMn includes a parallel connection of an n-channel MOS transistor N (N11–N1n) and a p-channel MOS transistor P (P11–P1n).

Signal potentials at internal nodes NDA and NDB of memory cells MC11–MC1n are transmitted directly to the corresponding transmission gates TM11–TM1n, respectively. The signal potential at the node NDB of the memory cell MC (MC11–MC1n) is fed to the gate of the n-channel MOS transistor N (N11–N1n) in the transmission gate TM (TM1–TMn), while the signal potential at the node NDA is fed to the gate of the p-channel MOS transistor (T11–T1n) in the transmission gate TM (TM1–TMn). Since the complementary signal potentials at the nodes NDA and NDB of the memory cells MC11–MC1n are transmitted directly to the transmission gates TM11 TM1n, there is no necessity of any additional circuit, such as an inverter, for producing a complementary signal to thereby realize utilization of the transmission gates without any increase of the circuit occupancy area. In each of the memory cells MC11–MC1n, the potential at the node NDA corresponds to a low (L) level (ground potential GND), while the potential at the node NDB corresponds to a high (H) level (supply voltage VDD).

In each transmission gate TM (TM11–TM1n), both of the p-channel MOS transistor P (P11–P1n) and the n-channel MOS transistor N (N11–N1n) are switched on. At the time of propagation of a high-level signal, the p-channel MOS transistor P (P11–P1n) is capable of propagating the signal of the VDD level without causing any loss of the signal amplitude. If the signal potential to be transmitted so rises that the operation region of the n-channel MOS transistor is rendered proximate to the saturation region, the p-channel MOS transistor operates in its non-saturation region (triode region) and is therefore capable of raising the signal potential fast. Also in the transmission gate, the output node ND (ND1–NDn) is driven by the drain currents of two transistors, so that the output node ND (ND1–NDn) can be charged (i.e., the parasitic capacitance CL1–CLn can be charged) faster than in a case where merely one n-channel MOS transistor is employed. Consequently, in comparison with the constitution where one n-channel MOS transistor is used as a switching element, it becomes possible to achieve faster transmission of the signal without causing any loss of the signal amplitude.

The drain current Ids supplied from the MOS transistor is proportional to the ratio W/L of a channel width W to a channel length L. Therefore, by setting the ratio W/L to a fixed value while reducing the sizes of the p-channel MOS transistor and the n-channel MOS transistor which are component elements of the transmission gate, the occupancy area of the transmission gate TM (TM11–TMn) can be approximately equalized to that of a switching element consisting of a single n-channel MOS transistor. Thus, an increase of the occupancy area of the switching element for programming an interconnection line network can be sufficiently suppressed even by utilizing the transmission gate as a switching element.

According to the third embodiment, as described above, CMOS transmission gates each comprised of a p-channel MOS transistor and an n-channel MOS transistor are employed to serve as switching elements for programming an interconnection line network, so that a signal turned from a low level to a high level can be propagated fast without causing any loss of the signal amplitude. Due to such transmission of the signal of the supply voltage VDD level without any signal amplitude loss, such meritorious advantage is provided that, in the logic circuit block LBB receiving a transmission signal, the p-channel MOS transistor in the input buffer (CMOS inverter) provided in the input port thereof is reliably switched off to consequently eliminate generation of any through current, hence reducing the current consumption. Furthermore, since the complementary signal potentials stored in the memory cells are utilized directly as signals for driving the transmission gates, there is no necessity of providing additional circuit elements to produce complementary signals for control of the transmission gates, thereby achieving another advantage that any increase area required interconnection line network programming region can be sufficiently suppressed.

MODIFICATION 1

Figure 12:
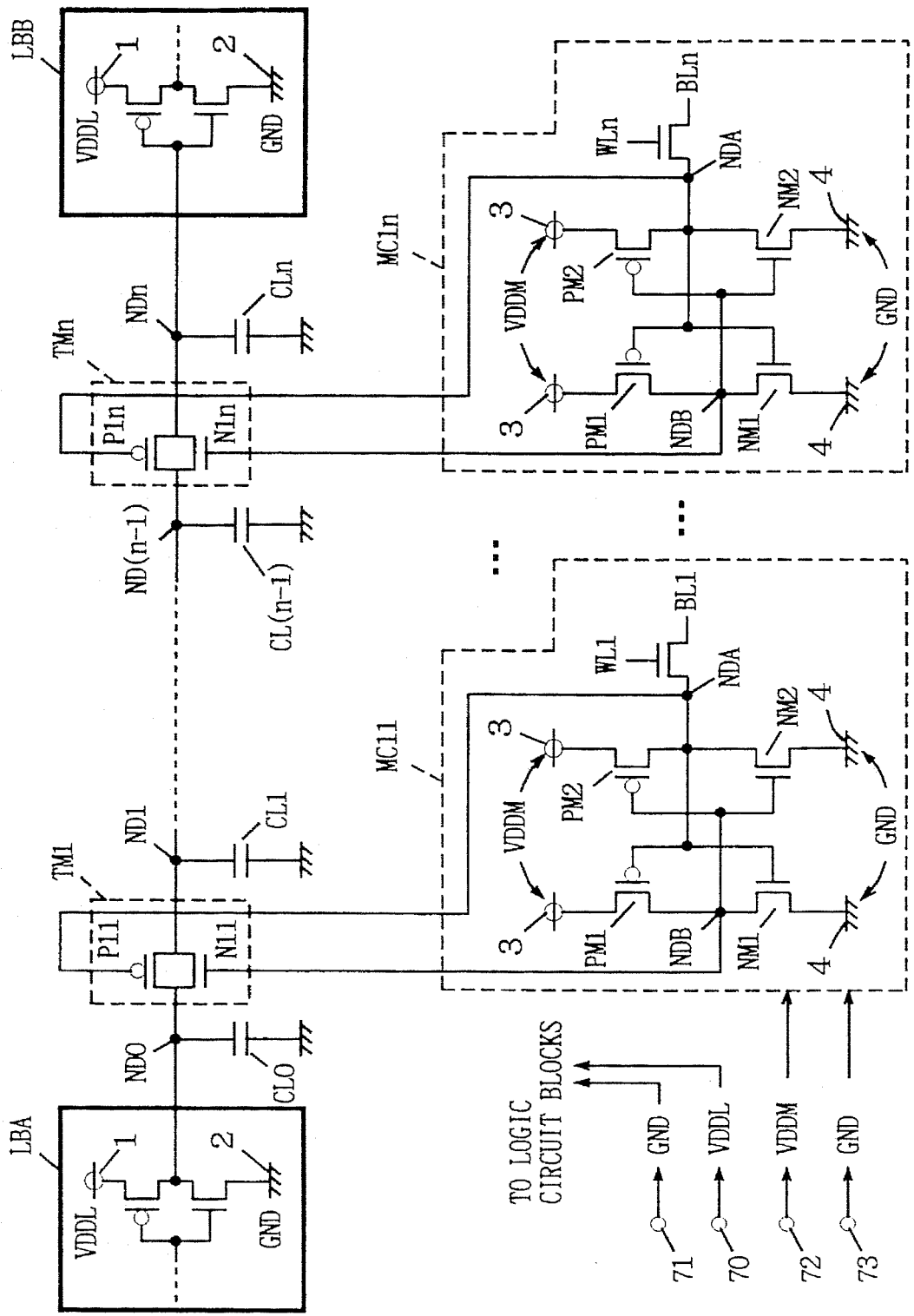
FIG. 12 shows a constitution of a first modification of the field programmable gate array according to the third embodiment of the invention.

FIG. 12 shows a constitution of a first modification of the third embodiment of the present invention. In the constitution of FIG. 12, a supply voltage VDDL and a ground potential GND are fed respectively to power supply nodes 1 and 2 of logic circuit blocks LBA and LBB, while a supply voltage VDDM and the ground potential GND are fed respectively to power supply nodes 3 and 4 of memory cells MC11–MC1n. Similarly to the constitution of FIG. 11, transmission gates TM1–TMn are employed as switching elements for establishing an interconnection line network.

The voltages VDDL and GND fed to power input terminals (nodes) 70 and 71 are supplied to the logic circuit blocks LBA and LBB, while the voltages VDDM and GND fed to power input terminals (nodes) 72 and 73 are supplied to the memory cells MC11–MC1n. Thus, the voltage supply paths for the logic circuit blocks LBA, LBB and the memory cells MC11–MC1n are provided separately.

In the constitution of FIG. 12, the voltage VDDM is fed to gates of n-channel MOS transistors N11–N1n in the transmission gates TM1–TMn. As in the aforementioned first embodiment, the voltage VDDM has a level sufficiently higher than the supply voltage VDDL fed to the logic circuit blocks LBA and LBB. Therefore the current supply capability of the n-channel MOS transistors N11–N1n is enhanced to consequently enable the transmission gates TM1–TMn to charge faster the parasitic capacitances CL1–CLn existent at the output portions of the transmission gates TM1–TMn. As a result, the signal propagation delay caused at the rise of the signal can be further reduced. In this case, the n-channel MOS transistors N11–N1n are capable of raising the signal up to the supply voltage VDDL level of the logic circuit blocks if the potential level of the supply voltage VDDM fed to the gates of the MOS transistors N11–N1n is sufficiently high, whereby the time required for the signal to reach the supply voltage VDDL level can be further shortened (since both of the p-channel MOS transistor and the n-channel MOS transistor serve to drive the signal up to the VDDL level).

MODIFICATION 2

Figure 13:
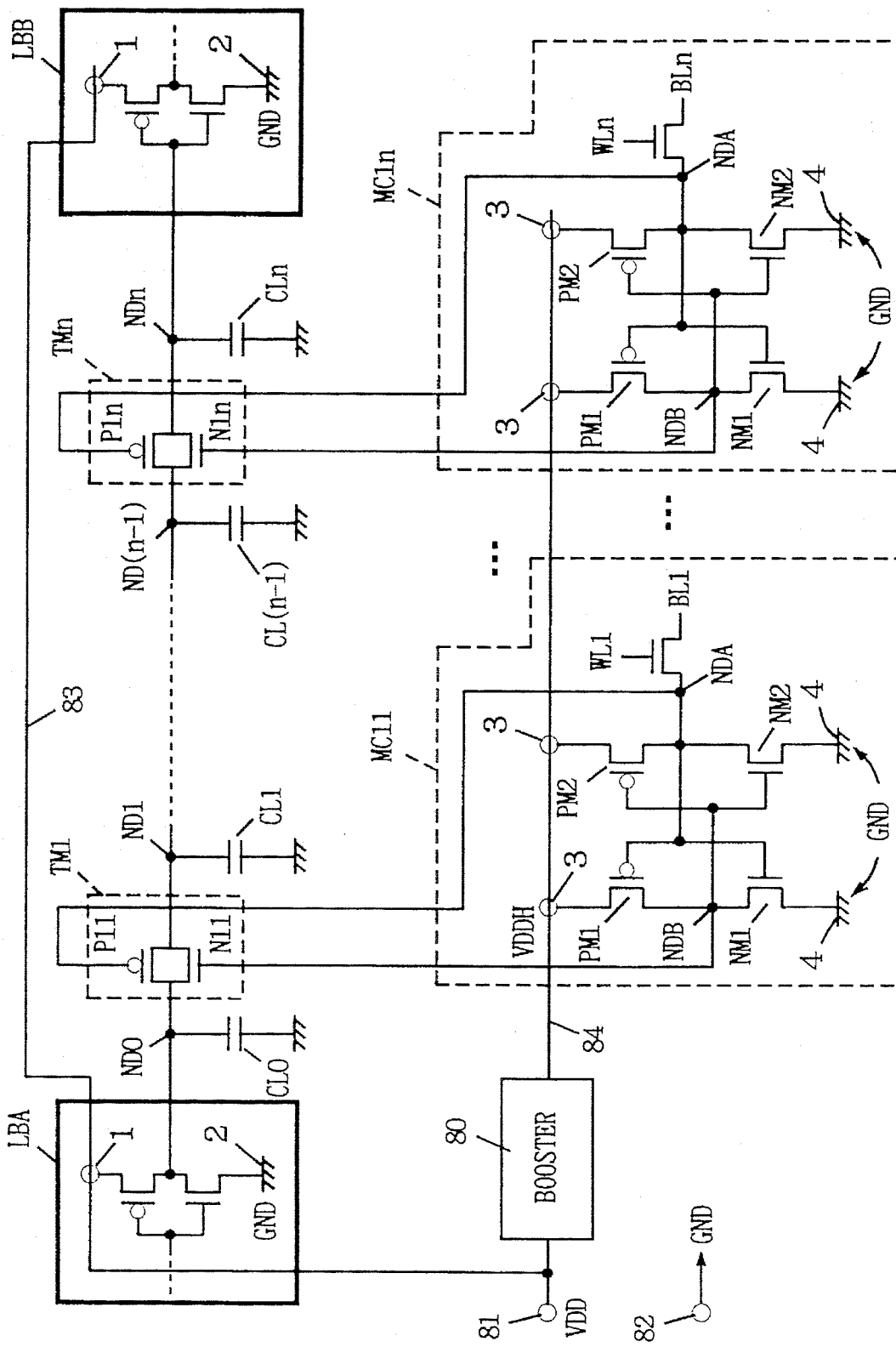
FIG. 13 shows a constitution of a second modification of the field programmable gate array according to the third embodiment of the invention.

FIG. 13 shows a constitution of a second modification of the third embodiment of the present invention. In the constitution of FIG. 13, there is provided a booster circuit 80 for generating a memory-cell supply voltage VDDH by boosting a supply voltage VDD fed to a power input terminal (node) 81 and then supplying the voltage VDDH to a power line 84. The memory-cell supply voltage VDDH generated by the booster circuit 80 is fed via the power line 84 to a power supply node 3 of each of memory cells MC11–MC1n. The supply voltage VDD fed to the power input terminal (node) 81 is transmitted to power supply nodes 1 in the logic circuit blocks LBA and LBB. The ground potential GND is fed via a power input terminal (node) 82 to both the logic circuit blocks LBA, LBB and the memory cells MS11–MC1n in common. The booster circuit 80 has such a configuration as shown in FIG. 6 for example. And its operation is the same as that in FIG. 12.

In the constitution of FIG. 13 also, CMOS transmission gates are employed as switching elements for programming an interconnection line network, so that a full-swing signal can be propagated fast. Due to internal generation of the memory-cell supply voltage by means of the booster circuit 80, it is possible to diminish the number of required power input terminals.

MODIFICATION 3

Figure 14:
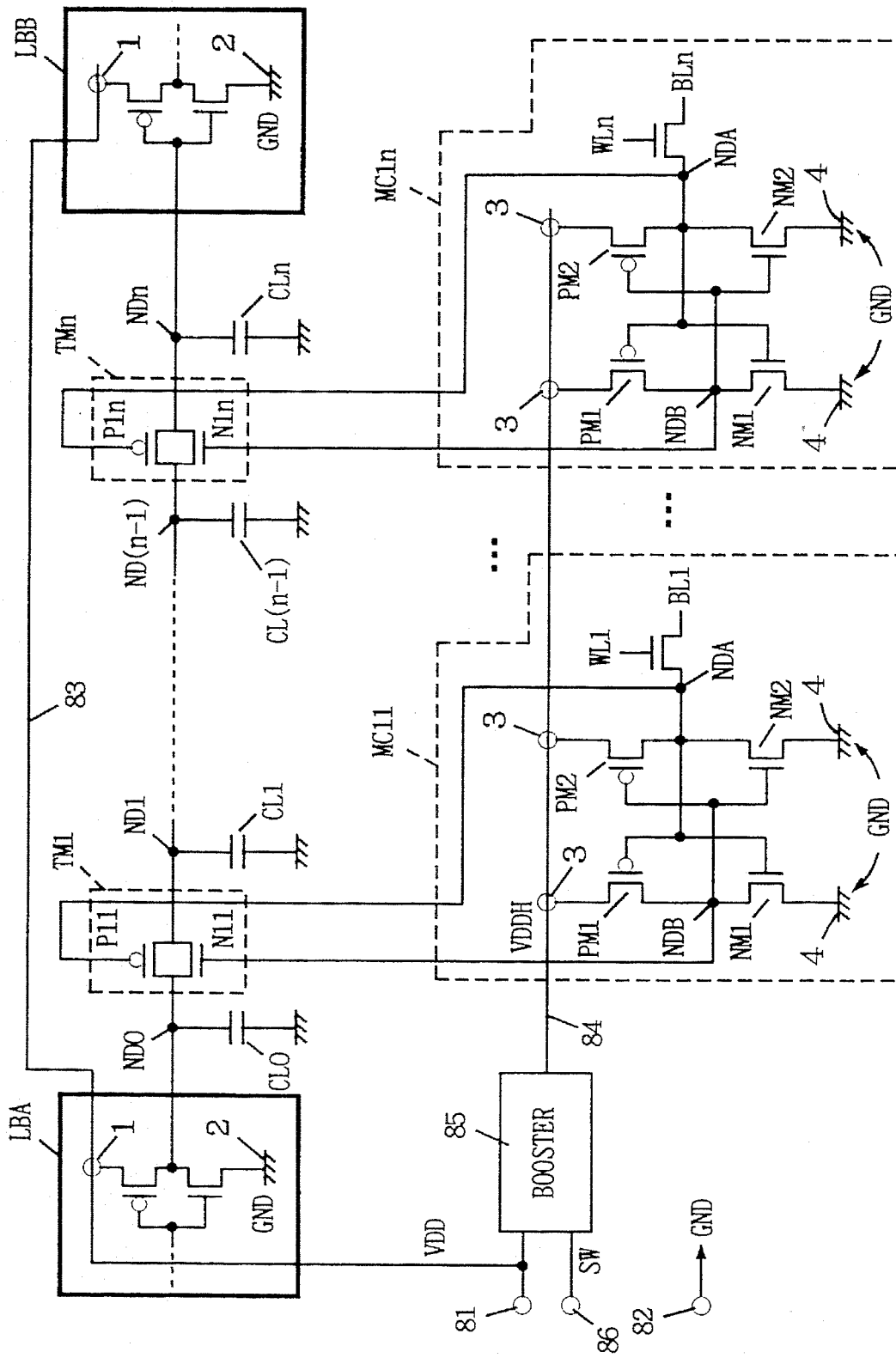
FIG. 14 shows a constitution of a third modification of the field programmable gate array according to the third embodiment of the invention.

FIG. 14 shows a constitution of a third modification of the third embodiment of the present invention. In the constitution of FIG. 14, an operation mode instruction signal SW is fed via a signal input terminal (node) 86 to a booster circuit 85 which in turn produces a memory-cell supply voltage VDDH from a supply voltage VDD fed to a power input terminal (node) 81. The booster circuit 85 executes its boosting operation (charging pump action) only when the signal SW is in an inactive state. The signal SW is rendered inactive during an interconnection line network programming mode (SRAM-cell data writing mode) or a standby mode, so that the operation of the booster circuit 85 is inhibited (i.e., the charging pump action is brought to a halt state) during such a period, whereby the current consumption is reduced. The other constitution of FIG. 14 is the same as that shown in FIG. 13. In FIG. 14, like component elements corresponding to those in FIG. 13 are denoted by like reference numerals or symbols.

The configuration of the booster circuit 85 may be the same as that shown in FIG. 8.

MODIFICATION 4

Figure 15:
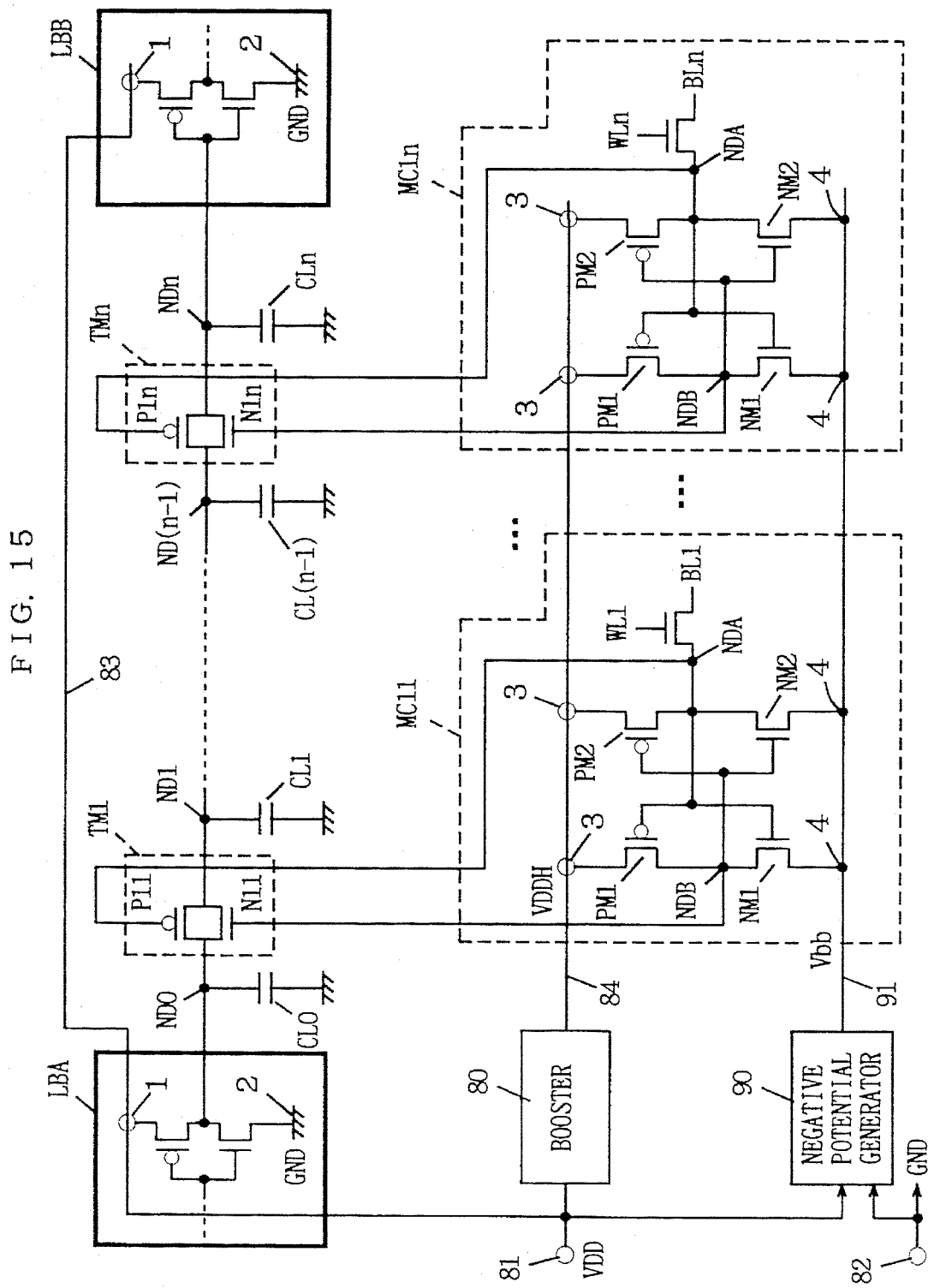
FIG. 15 shows a constitution of a fourth modification of the field programmable gate array according to the third embodiment of the invention.

FIG. 15 shows a constitution of a fourth modification of the third embodiment of the present invention. In the embodiment of FIG. 15, there is further provided a negative voltage generator circuit 90 for generating a negative voltage Vbb from a supply voltage VDD and a ground potential GND fed to power input terminals (nodes) 81 and 82 respectively. Although the configuration of this negative voltage generator circuit 90 will be described in detail later, this circuit generates a negative voltage Vbb by executing a charging pump action and feeds the voltage Vbb via a power line 91 to other power supply nodes 4 of memory cells MC11–MC1n. A boosted voltage VDDH obtained from a booster circuit 80 is fed via a power line 84 to power supply nodes 3 of the memory cells MC11–MC1n. Therefore, the potential at the nodes NDB of the memory cells MC11–MC1n is equal to the voltage VDDH, while the potential at the nodes NDA is equal to the negative voltage Vbb. In the transmission gates TM1–TMn, n-channel MOS transistors N11–N1n receive the boosted voltage VDDH at the gates thereof, while p-channel MOS transistors P11–P1n receive the negative voltage Vbb at the gates thereof. Consequently, the current supply capability of the p-channel MOS transistors P11–P1n is further enhanced in comparison with a case where they receive the ground potential at the gates, so that when a signal turning from a low level to a high level is outputted from the logic circuit block LBA, the signal can be propagated faster to thereby realize a significant reduction of the propagation delay in the signal rise to a high level.

Figure 16:
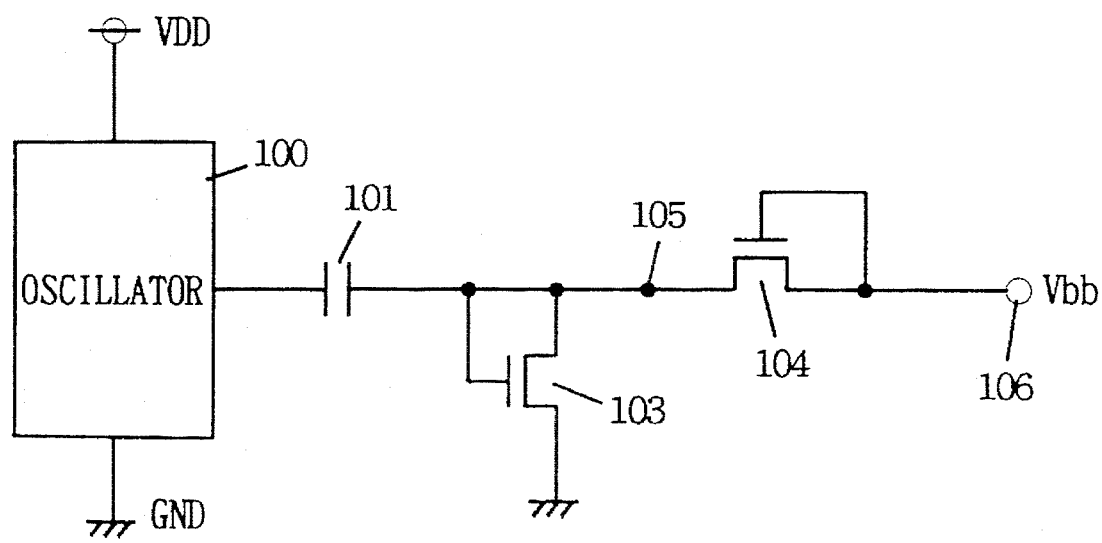
FIG. 16 shows an exemplary configuration of a negative voltage generator circuit included in FIG. 15.

FIG. 16 shows an exemplary configuration of the negative voltage generator circuit included in FIG. 15. In FIG. 16, the negative voltage generator circuit 90 includes an oscillator 100 for generating a pulse signal which oscillates between the supply voltage VDD and the ground potential GND, a capacitor 101 to receive the pulse signal from the oscillator 100, an n-channel MOS transistor 103 disposed between a node 105 and a ground potential node, and an n-channel MOS transistor 104 disposed between the node 105 and an output node 106. The gate and drain of the MOS transistor 103 are connected to the node 105, while the gate and drain of the MOS transistor 104 are connected to the output node 106. Now the operation will be described below.

When the output pulse signal of the oscillator 100 has been turned from a low level to a high level, the potential at the node 105 is raised by the charging pump action of the capacitor 101, whereby the MOS transistor 104 is switched off while the MOS transistor 103 is switched on. Then the node 105 is discharged via the MOS transistor 103, and the potential thereat is changed approximately to Vth which is the threshold voltage of the MOS transistors 103 and 104.

When the output pulse signal of the oscillator 100 has been turned from a high level to a low level, the potential at the node 105 is lowered by the capacitor 101 so that the MOS transistor 103 is switched off. When the potential at the node 106 is higher than the potential at the node 105, the MOS transistor 104 is switched on to cause a flow of positive charge from the node 106 into the node 105. More specifically, electrons flow out from the node 105 to the node 106, so that the potential at the output node 106 is lowered. As a result of repetition of this operation, the potential at the node 105 is changed, in a stable state, between two values of Vth and −Vcc+Vth. Upon fall of the potential at the node 105, electrons flow out to the output node 106 via the MOS transistor 104, so that the potential at the node 106 is lowered. The potential at the output node 106 is finally lowered down to a level of −(Vcc−2·Vth). A negative voltage Vbb is generated from the output node 106. The configuration of the negative voltage generator circuit shown in FIG. 16 is merely illustrative, and any other configuration may be utilized as well.

MODIFICATION 5

Figure 17:
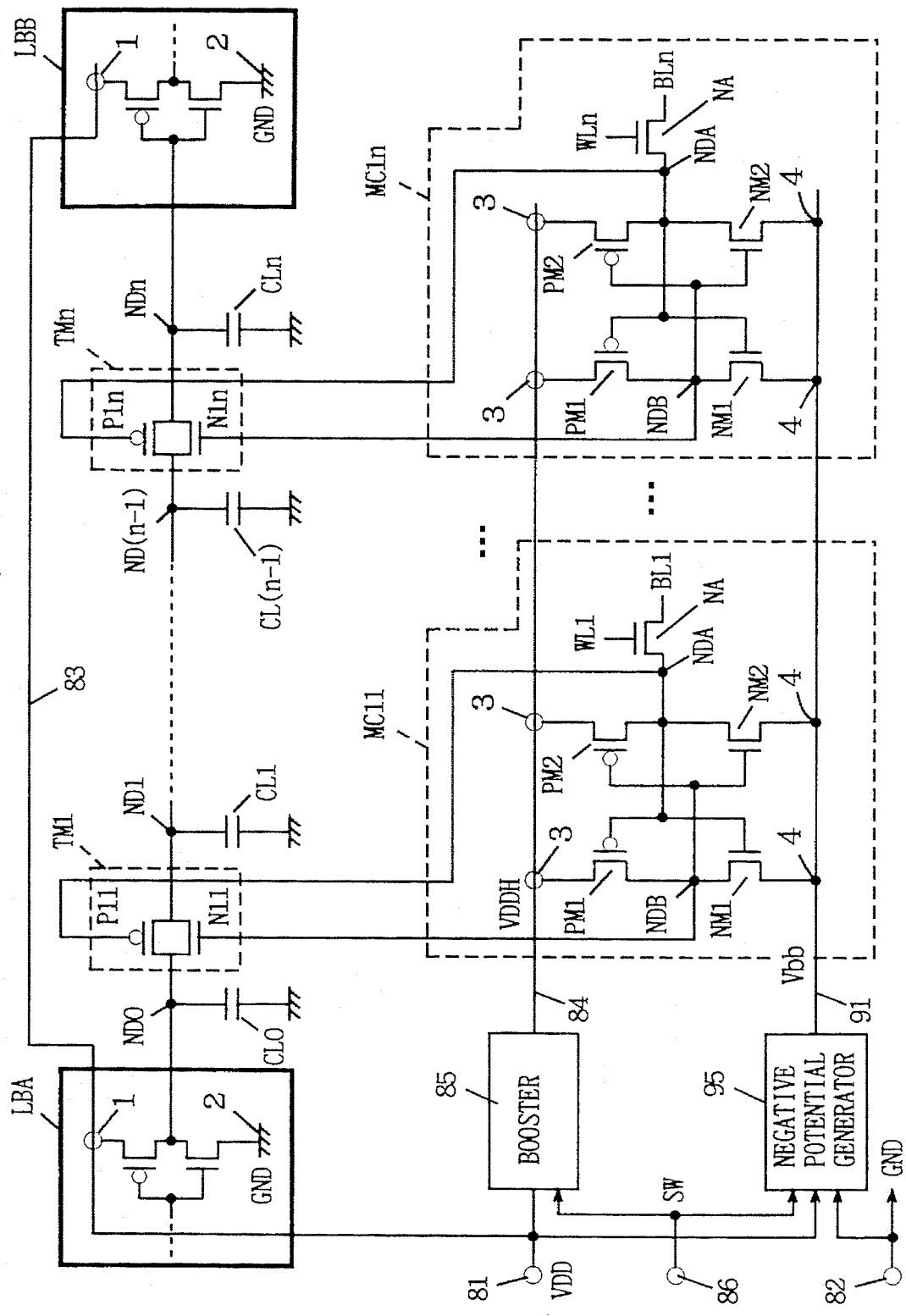
FIG. 17 shows a constitution of a fifth modification of the field programmable gate array according to the third embodiment of the invention.

FIG. 17 shows a constitution of a fifth modification of the third embodiment of the present invention. In the constitution of FIG. 17, an operation mode instruction signal SW is fed to a booster circuit 85 and a negative voltage generator circuit 95 via a signal input terminal 86. The other constitution of this figure is the same as that shown in FIG. 15, and like component elements corresponding to those in FIG. 15 are denoted by like reference numerals or symbols. The operation mode instruction signal SW is rendered inactive during an interconnection line network programming mode and a standby mode. During a chip operation, the signal SW is rendered active, and both of the booster circuit 85 and the negative voltage generator circuit 95 perform a charging pump action to generate predetermined voltages VDDH and Vbb respectively. Particularly when data are written in SRAM cells MC11–MC1n during the interconnection line network programming mode, the following advantage can be achieved by halting the operation of the negative voltage generator circuit 95.

In the data writing mode, a signal of the ground potential GND level is transmitted to data lines BL1–BLn (since data are externally written). In this stage of the operation, the potential at a node NDB is turned to a high level, and a MOS transistor NM2 is switched on. At this time, a power supply node 4 is connected to data lines BL1–BLn via a node NDA and an access transistor NA, so that when the negative voltage generator circuit 95 is generating a negative voltage Vbb, a large current flows in this data transfer path. Therefore, such current flow can be prevented by halting the operation of the negative voltage generator circuit 95 during the interconnection line network programming mode and turning the potential on the power line 91 to the ground potential GND level. In each of non-selected memory cells, the potential on the word line WL has a low level corresponding to the ground potential GND, and when the potential on the data line BL is turned to be negative, the access transistor is switched on and the potential at its internal storage node may be changed. In such a case, the data in the memory cell after completion of the writing may be changed. It is to be noted that a column of memory cells are connected to one data line, and a row of memory cells are connected to one word line. However, in such interconnection line network programming mode, it is possible to ensure reliable prevention of any change of storage data by halting the operation of the negative voltage generator circuit 95 during the interconnection line network programming mode and turning the potential on the power supply line 91 to the ground potential level.

The negative voltage generator circuit 95 may be formed by utilizing the configuration of the oscillator 100 shown in FIG. 16 or that of the oscillator including three-stage NAND circuits shown in FIG. 8. The booster circuit 85 may be formed by utilizing the configuration shown in FIG. 8.

Each of the constitutions shown in FIGS. 15 and 17 may be so altered that the supply voltage VDD is fed to the booster circuit 85 and the negative voltage generator circuit 95 via separate power input terminals, and also that the supply voltage VDD is fed to the logic circuit blocks, the booster circuit and the negative voltage generator circuit via separate power input terminals respectively.

According to the constitution of FIG. 17, the operations of the booster circuit and the negative voltage generator circuit are kept at a halt state during the standby and interconnection line network programming modes, whereby it is rendered possible to greatly reduce the current and power consumption with the advantage that accurate data can be written in the memory cells even in the configuration applying a negative voltage.

MODIFICATION 6

Figure 18:
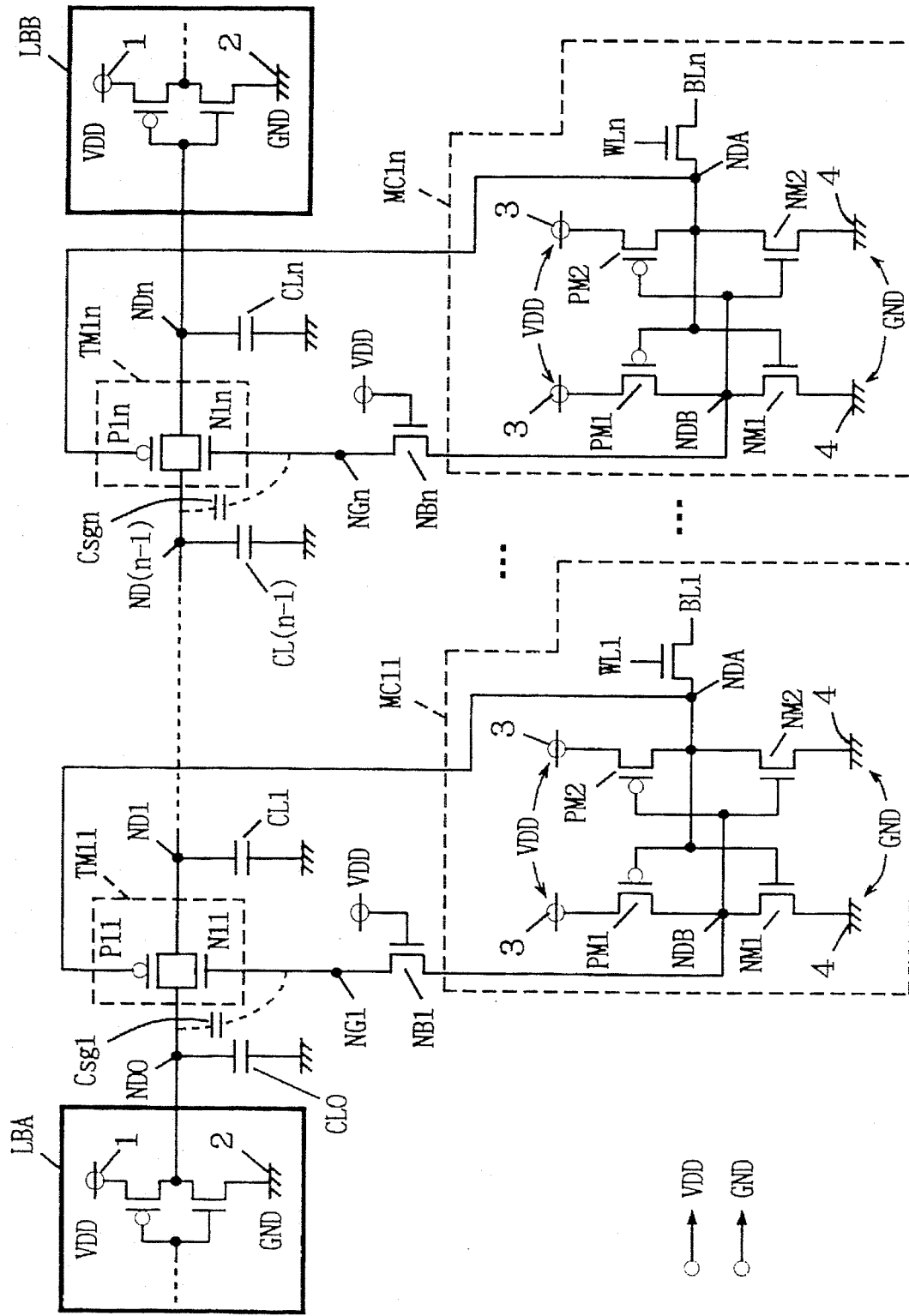
FIG. 18 shows a constitution of a sixth modification of the field programmable gate array according to the third embodiment of the invention.
Figure 19:
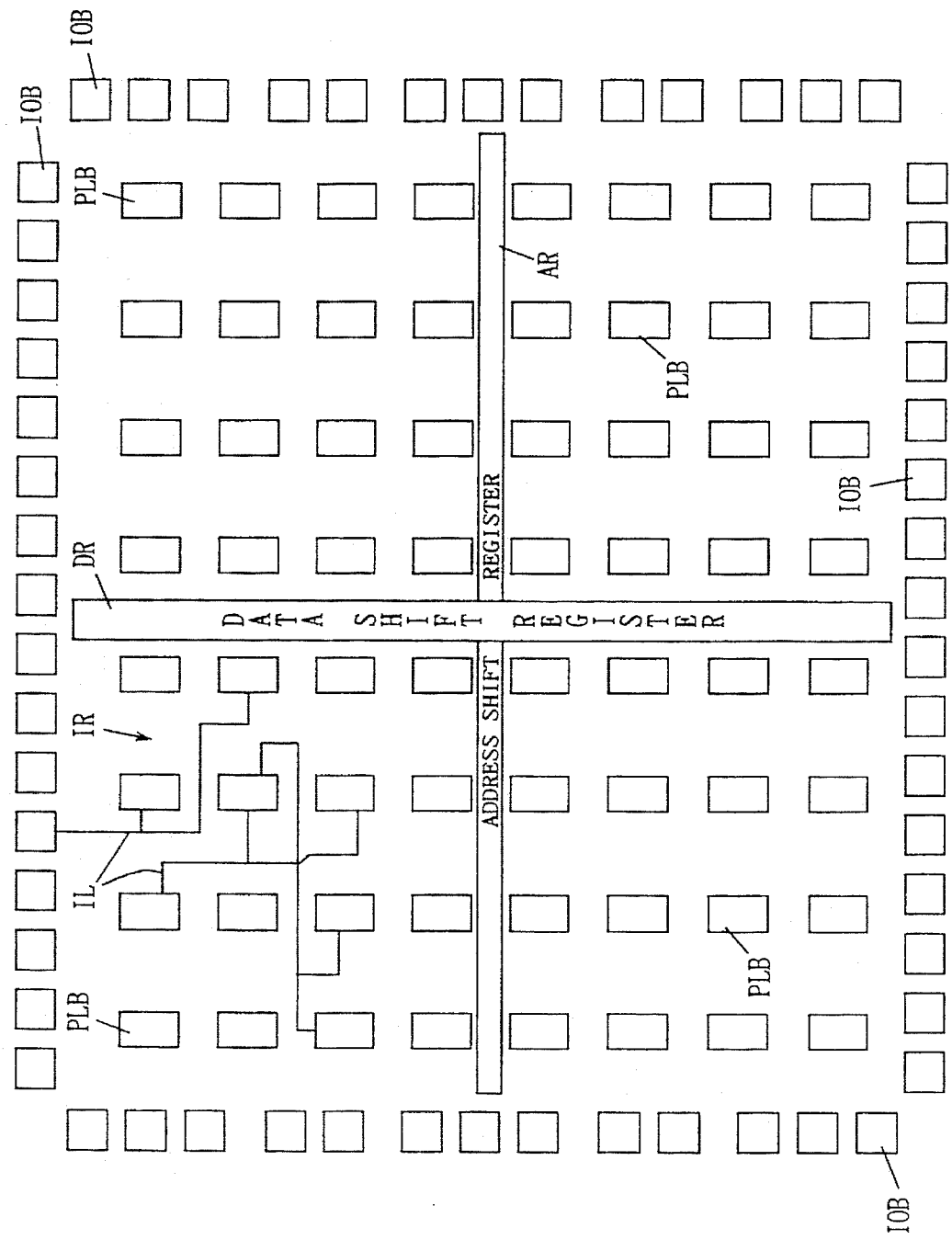
FIG. 19 schematically shows a whole constitution of a conventional field programmable gate array.
Figure 20:
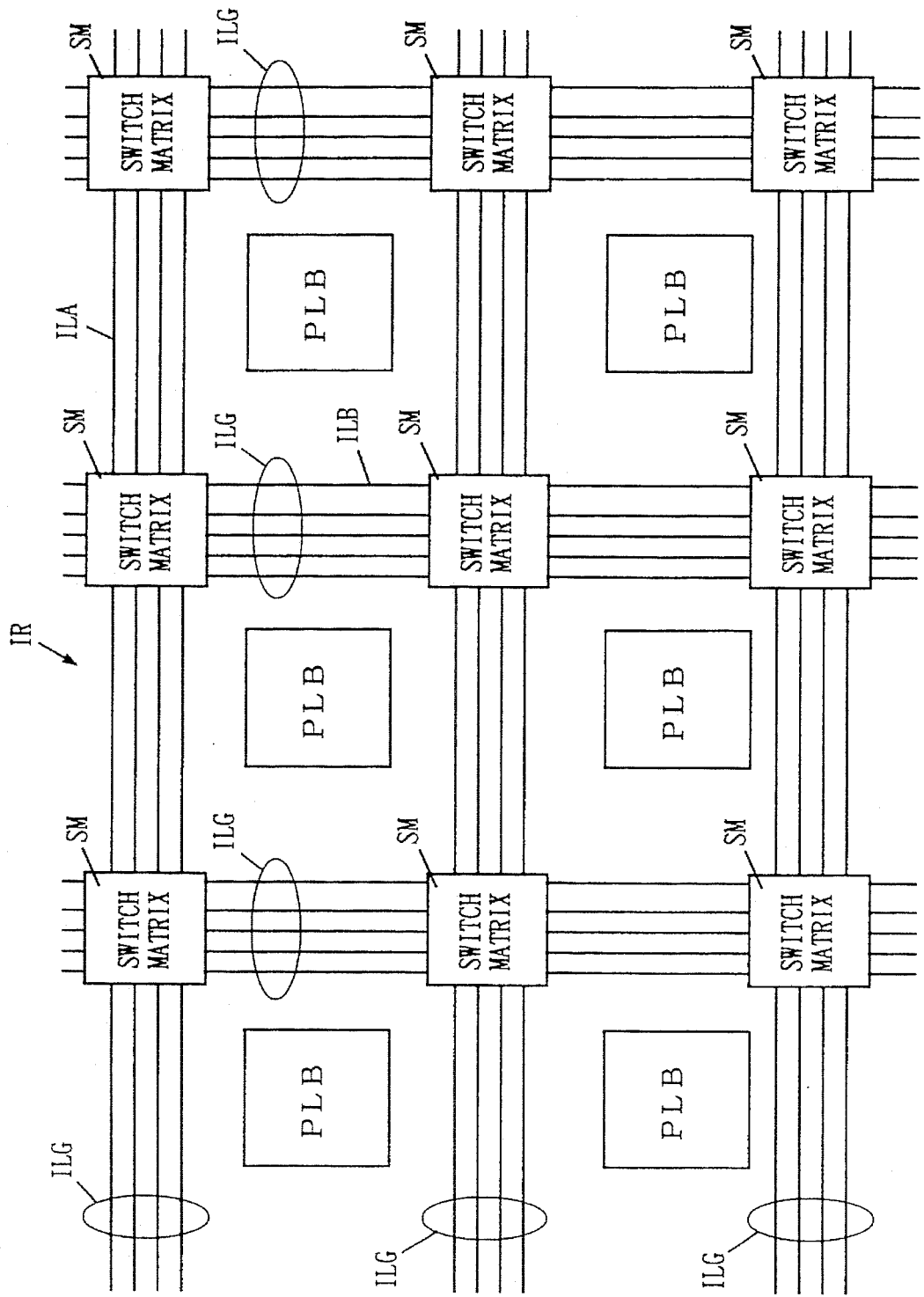
FIG. 20 schematically shows a configuration of interconnection line region in the field programmable gate array of FIG. 19.
Figure 21:
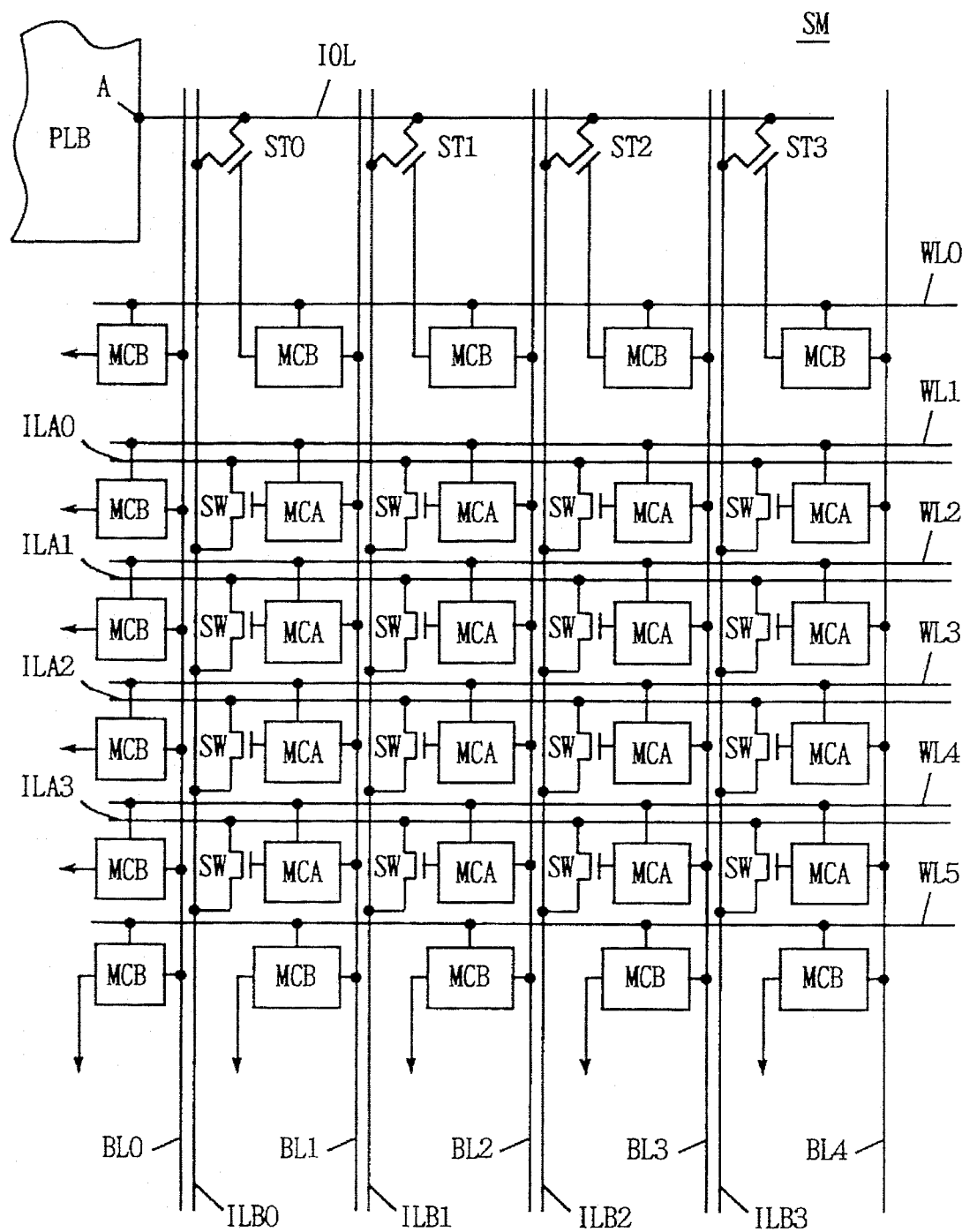
FIG. 21 shows a detailed structure of a switch matrix included in FIG. 20.
Figure 22:
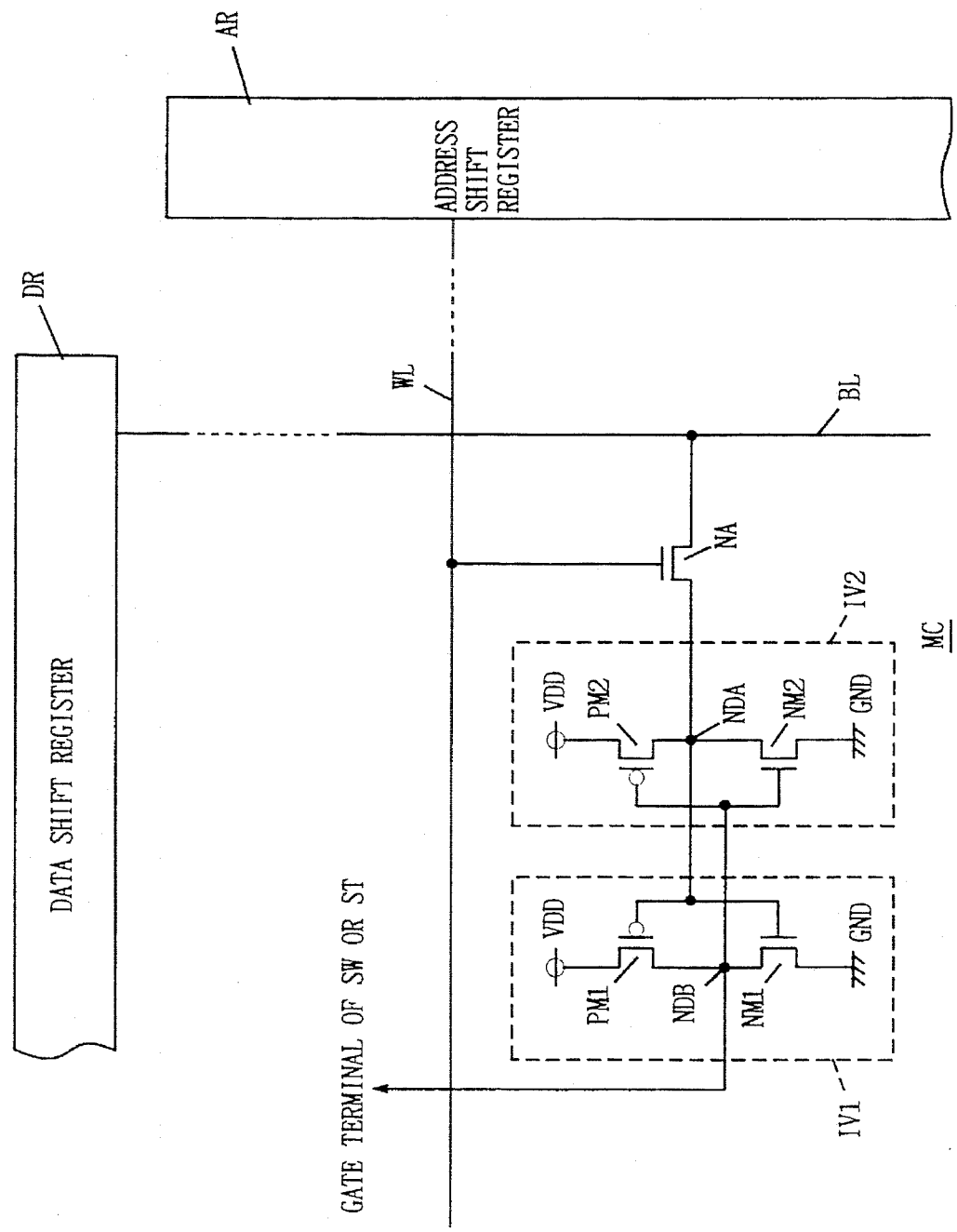
FIG. 22 shows an exemplary structure of a memory cell included in FIG. 21.
Figure 23:
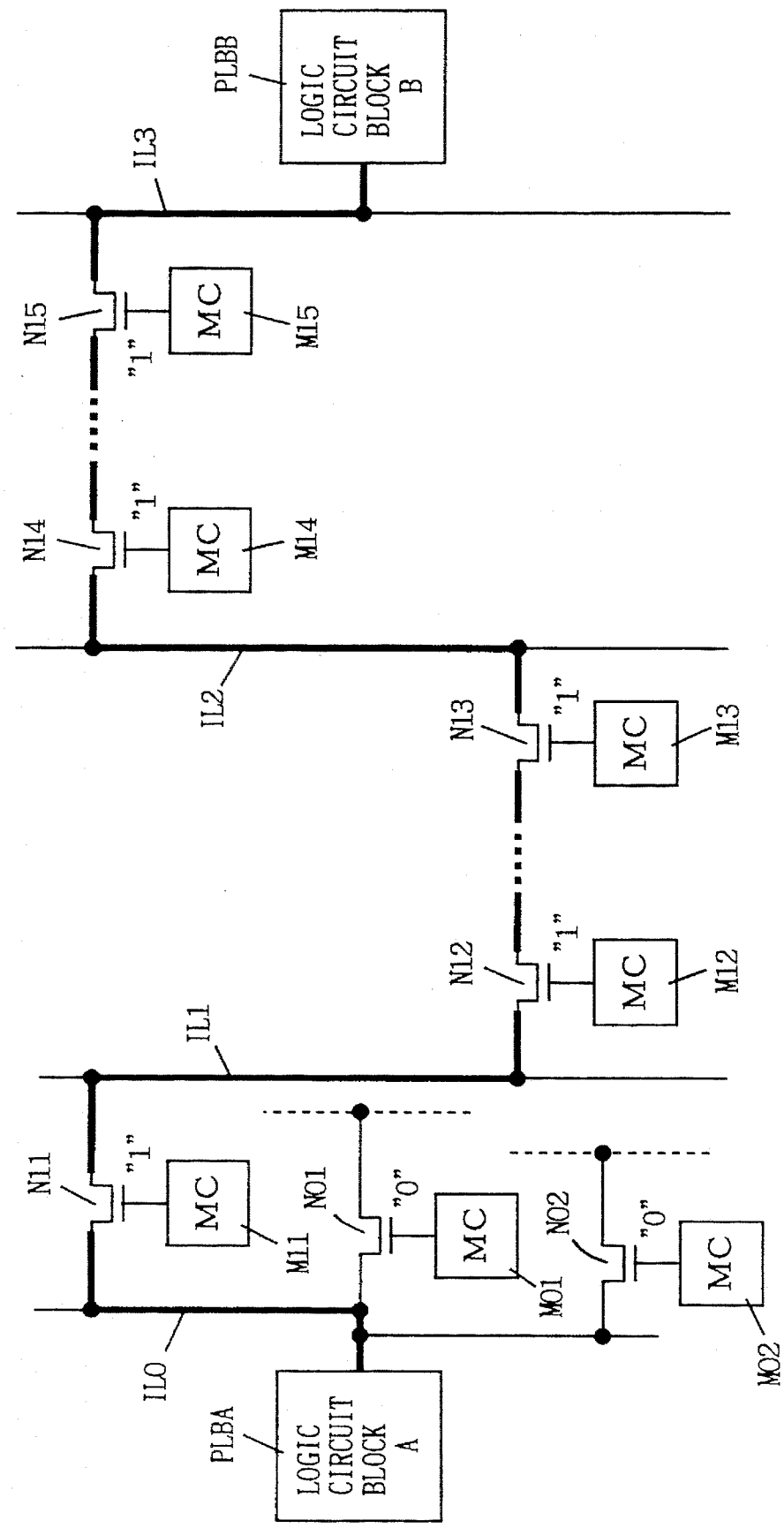
FIG. 23 is an explanatory diagram illustrating how a signal propagation path is programmed between two logic circuit blocks in the field programmable gate array.

FIG. 18 shows a constitution of a sixth modification of the third embodiment of the present invention. In the constitution of FIG. 18, a supply voltage VDD and a ground potential GND are fed respectively to power supply nodes 1 and 2 of logic circuit blocks LBA and LBB, and similarly the supply voltage VDD and the ground potential GND are fed respectively to power supply nodes 3 and 4 of memory cells MC11–MC1n. Transmission gates TM11–TM1n serving as switching elements for interconnection line network program are connected in a signal propagation path between the logic circuit blocks LBA and LBB. Signal potentials at the nodes NDA of the memory cells MC11–MC1n are transmitted respectively to gates of p-channel MOS transistors P11–P1n in the transmission gates TM11–TM1n. Separating n-channel MOS transistors NB1–NBn, which receive the supply voltage VDD at the gates thereof, are disposed between the n-channel MOS transistors N11–N1n in the transmission gates TM11–TM1n and the nodes NDB of the corresponding memory cells MC11–MC1n. Such separating n-channel MOS transistors NB1–NBn function as decoupling transistors and serve to separate the gates (nodes NG1–NGn) of the corresponding n-channel MOS transistors N1–Nn from the nodes NB of the corresponding memory cells MC11–MC1n.

When the signal from the logic circuit block LBA is turned from a low level to a high level, the potential at the nodes NG1–NGn of the n-channel MOS transistors N11–N1n in the transmission gates TM11–TM1n is raised by the self-boost action due to the parasitic capacitances Csg1–Csgn existing between the gates and sources of the MOS transistors N11–N1n. Consequently, the current supply capability of the n-channel MOS transistors N11–N1n is enhanced to charge fast the parasitic capacitances CL1–CLn present at the respective output portions, hence accomplishing fast propagation of the signal turned from a low level to a high level, to reduce the propagation delay in the signal rise to the high level.

The constitution shown in FIG. 18 may be so altered that a negative voltage Vbb, instead of the ground potential GND, is fed to the power supply nodes (ground potential nodes) 4 of the memory cells MC11–MC1n.

As mentioned, in the third embodiment where CMOS transmission gates are employed to serve as switching elements, it is possible to achieve fast signal propagation and reliable suppression of the signal amplitude loss, hence realizing an improved field programmable gate array which is capable of performing a stable operation even at a low supply voltage with compensation for the high-level and low-level signal potential loss.

According to the present invention, as described hereinabove, it becomes possible to significantly diminish the signal propagation delay in an interconnection line network which includes switching elements and interconnection lines to constitute a signal propagation path between logic circuit blocks, and further possible to attain reliable suppression of the high-level signal potential drop that results from the threshold voltage of the n-channel MOS transistors serving as switching elements, thereby accomplishing a superior field programmable gate array which performs a stable operation even at a low supply voltage.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. The field programmable gate array comprising:
   a plurality of logic blocks operating with voltages applied to a first power supply node and a second power supply node respectively;
   a plurality of interconnection lines;
   a plurality of switching elements for selectively interconnecting said plurality of interconnection lines among said logic blocks;
   a plurality of memory cells disposed in correspondence to said switching elements respectively and connected between a third power supply node and a fourth power supply node, each of the memory cells storing data to determine an on and off state of a corresponding switching element and setting the corresponding switching element in an on and off state in accordance with the stored data;
   a first voltage source for feeding predetermined voltages to the first and second power supply nodes for said plurality of logic blocks; and
   a second voltage source for feeding voltage to said third and fourth power supply nodes, the difference between the voltages at said third and fourth power supply nodes being greater than the difference between the voltages at said first and second power supply nodes wherein said second voltage source includes
   voltage change means coupled to said voltage sources to change the voltages fed from said voltage sources in such a manner that the difference between the changed voltages becomes greater in absolute value than the difference between the voltages fed to said first and second power supply nodes, and feeding the changed voltages to said third and fourth power supply nodes.

2. The field programmable gate array according to claim 1, further comprising a means for inhibiting the operation of said voltage change means in response to a standby mode instruction signal indicating an inactive chip operation.

3. The field programmable gate array according to claim 1, wherein said voltage changing means includes
   a first voltage generator for generating a voltage higher than the voltage applied to said first power supply node for application to said third power supply node, and
   a second voltage generator for generating a voltage not higher than the voltage applied to said second power supply node for application to said fourth power supply node.

4. The field programmable gate array according to claim 3, wherein each of the switching elements comprises a transmission gate including a pair of p channel and n channel field effect transistors, and wherein said second voltage generator generates a negative potential.

5. The field programmable gate array according to claim 3, wherein said second voltage generator produces a voltage equal in level to the voltage applied to the second power supply node.

6. The field programmable gate array according to claim 1, wherein said first voltage source includes a first node receiving externally applied voltage to be fed to said first and second power supply nodes, and said second voltage source includes a second node provided separately from said first node, for receiving externally applied voltage to be transmitted to said third and fourth power supply nodes.

7. A field programmable gate array comprising:
   a plurality of logic blocks;
   a plurality of interconnection lines;
   a plurality of switching elements for selectively interconnecting said plurality of interconnection lines between said plurality of logic blocks;
   a plurality of memory cells disposed in correspondence to said switching elements respectively, each of the memory cells storing data to determine an on and off state of a corresponding switching element and setting the corresponding switching element in an on and off state in accordance with the stored data; and
   a plurality of transfer elements disposed between said memory cells and said switching elements respectively, each of the transfer elements functioning to transfer the output of a corresponding memory cell to a control electrode of the corresponding switching element;
   wherein each of said transfer elements transfers the output of the corresponding memory cell to the control electrode of the corresponding switching element, and separates the corresponding memory cell from said control electrode when the output of the corresponding memory cell has a potential level for turning on the corresponding switching element.

8. The field programmable gate array according to claim 7, wherein each of the memory cells receives a power supply potential to output a data at a level of the power supply potential for turning on a corresponding switching element, and wherein each of the transfer elements comprises an insulated gate type field effect transistor receiving a reference potential no less than said power supply potential at a control gate.

9. The field programmable gate array comprising:
   a plurality of logic blocks;
   a plurality of interconnection lines;
   a plurality of transmission gates for selectively interconnecting said plurality of interconnection lines between said plurality of logic blocks, each of the transmission gates including a p-channel field effect transistor and an n-channel field effect transistor; and
   a plurality of memory cells disposed in correspondence to said transmission gates respectively, each of the memory cell storing data to determine an on and off state of a corresponding transmission gate and sets the corresponding transmission gate in an on/off state in accordance with the stored data a first voltage source for feeding first and second operation power supply voltages to said plurality of logic blocks, and a second voltage source for feeding third and fourth operation power supply voltages to said plurality of memory cells, the difference between the first and second power supply voltages being smaller than the difference between the third and fourth power supply voltages.

10. The field programmable gate array according to claim 9, wherein said third power supply voltage is a positive voltage, and said fourth power supply voltage is a negative voltage.

11. The field programmable gate array according to claim 9, wherein each of said memory cells is supplied with the third operation power supply voltage, and said field programmable gate array further includes a plurality of transfer elements provided between each of the memory cells and each of the switching elements, for capacitively decoupling gates of n-channel field effect transistors of corresponding switching elements and corresponding memory cells, when corresponding memory cells supply data at a level of the operation power supply voltage for turning on the corresponding switching elements.

12. The field programmable gate array according to claim 9, wherein said second voltage source comprises voltage changing circuitry coupled to said first voltage source for changing the first and second voltages fed from said first voltage source to said third and fourth voltages, and inhibition gate responsive to a mode signal indicating no operation of said plurality of logic blocks for inhibiting the operation of said voltage changing circuitry.

13. A field programmable gate array comprising:

a plurality of logic blocks operating with voltages applied to a first power supply node and a second power supply node respectively;

a plurality of interconnection lines;

a plurality of transmission gates for selectively interconnecting said plurality of interconnection lines between said plurality of logic blocks, each transmission gate including a p-channel field effect transistor and an n-channel field effect transistor;

a plurality of memory cells disposed in correspondence to said transmission gates respectively and connected between a third power supply node and a fourth power supply node, each of the memory cells storing therein data to determine an on and off state of a corresponding transmission gate and sets the corresponding transmission gate in an on or off state in accordance with the stored data having one of the voltage levels of said third and fourth power supply nodes;

a first voltage source for feeding predetermined voltages to the first and second power supply nodes for said plurality of logic blocks; and a second voltage source for changing the voltages fed from said first voltage source, in such a manner that the difference between the changed voltages becomes greater than the difference between the voltages fed to said first and second power supply nodes, and feeding the changed voltages to said third and fourth power supply nodes.

14. The field programmable gate array according to claim 13, wherein said second voltage source comprises a voltage change means coupled to said first voltage source and serving to change the voltages fed from said first voltage source, and means for inhibiting the operation of said voltage change means in response to a standby mode indication signal indicating no operation of the logic blocks.

15. A field programmable gate array comprising:

a plurality of logic blocks;

a plurality of interconnection lines;

a plurality of transmission gates for selectively interconnecting said plurality of interconnection lines between said plurality of logic blocks, each of the transmission gates including a p-channel field effect transistor and an n-channel field effect transistor;

a plurality of memory cells disposed in correspondence to said transmission gates respectively each of the memory cell storing data to determine an on and off state of a corresponding transmission gate and producing a complementary signal outputs for setting the corresponding transmission gate in an on or off state in accordance with the stored data; and a plurality of transfer means disposed between said memory cells and the transmission gates respectively, each of the transfer means and functioning to transfer the complementary signal outputs, of a corresponding memory cell to a control electrode of a corresponding transmission gate;

wherein each of said transfer means includes a transfer element, and when the outputs of the corresponding memory cell switch on the corresponding transmission gate, the transfer element separates the corresponding memory cell from a corresponding field effect transistor in the corresponding transmission gate in the transfer path of at least one complementary signal output of the corresponding memory cell while maintaining the field effect transistor in an on-state.

* * * * *